(12) United States Patent
Uchiyama et al.

(10) Patent No.: US 10,567,104 B2
(45) Date of Patent: *Feb. 18, 2020

(54) COMMUNICATION CONTROL APPARATUS, RADIO COMMUNICATION APPARATUS, COMMUNICATION CONTROL METHOD, AND RADIO COMMUNICATION METHOD

(71) Applicant: SONY CORPORATION, Tokyo (JP)

(72) Inventors: Hiromasa Uchiyama, Tokyo (JP); Ryota Kimura, Tokyo (JP); Sho Furuichi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/128,253

(22) Filed: Sep. 11, 2018

(65) Prior Publication Data

US 2019/0028226 A1    Jan. 24, 2019

Related U.S. Application Data

(63) Continuation of application No. 15/520,004, filed as application No. PCT/JP2015/071689 on Jul. 30, 2015, now Pat. No. 10,148,380.

(30) Foreign Application Priority Data

Oct. 28, 2014    (JP) .................................. 2014-218937

(51) Int. Cl.
*H04J 13/00* (2011.01)
*H03M 13/27* (2006.01)
(Continued)

(52) U.S. Cl.
CPC ......... *H04J 13/0007* (2013.01); *H03M 13/27* (2013.01); *H03M 13/6502* (2013.01);
(Continued)

(58) Field of Classification Search
None
See application file for complete search history.

(56) References Cited

U.S. PATENT DOCUMENTS 9,445,430 B2    9/2016  Nobusawa et al.
10,136,468 B2 *  11/2018  Kimura ............... H04W 72/044
(Continued)

FOREIGN PATENT DOCUMENTS

CN    103563257 A    2/2014
CN    104509058 A    11/2017
(Continued)

OTHER PUBLICATIONS

Yoshizawa et al, "Hardware Implementation of an Interference Canceller for IDMA Wireless Communication," 2013, pp. 645-650.
(Continued)

*Primary Examiner* — Kevin D Mew
(74) *Attorney, Agent, or Firm* — Chip Law Group

(57) ABSTRACT

In order provide a communication control apparatus, a radio communication apparatus, a communication control method, a radio communication method, and a program that are capable of contributing to improving a radio communication technology related to IDMA, a communication control apparatus is provided. The communication control apparatus includes a communication unit configured to communicate with a radio communication apparatus of a radio communication system using interleave division multiple access (IDMA); and a control unit configured to allocate an interleaver type of an interleaver to be used for IDMA by the radio communication apparatus.

35 Claims, 16 Drawing Sheets

(51) Int. Cl.
*H04W 28/16* (2009.01)
*H04W 72/04* (2009.01)
*H03M 13/00* (2006.01)

(52) U.S. Cl.
CPC ... *H03M 13/6505* (2013.01); *H03M 13/6508* (2013.01); *H04W 28/16* (2013.01); *H04W 72/04* (2013.01); *H04W 72/042* (2013.01); *H03M 13/2728* (2013.01); *H03M 13/2742* (2013.01); *H03M 13/2782* (2013.01); *H03M 13/2789* (2013.01)

(56) References Cited

U.S. PATENT DOCUMENTS

| | | | |
|---|---|---|---|
| 10,148,380 B2 * | 12/2018 | Uchiyama | H04J 13/0007 |
| 10,219,249 B2 * | 2/2019 | Kimura | H04J 11/00 |
| 2008/0285666 A1 * | 11/2008 | Wang | H04B 7/022 375/260 |
| 2009/0055701 A1 * | 2/2009 | Hoshino | H04L 1/0009 714/748 |
| 2009/0203324 A1 * | 8/2009 | Matsumoto | H04L 1/0009 455/69 |
| 2010/0039966 A1 | 2/2010 | Agarwal et al. | |
| 2010/0189162 A1 | 7/2010 | Yoshimoto et al. | |
| 2011/0182236 A1 | 7/2011 | Matsumoto et al. | |
| 2011/0261774 A1 | 10/2011 | Lunttila et al. | |
| 2014/0119352 A1 * | 5/2014 | Matsumoto | H04L 1/0043 370/337 |
| 2015/0119051 A1 | 4/2015 | Kishiyama | |
| 2015/0237651 A1 * | 8/2015 | Nobusawa | H04W 72/121 370/329 |
| 2015/0264668 A1 * | 9/2015 | Takehana | H04W 72/04 370/329 |
| 2016/0036569 A1 | 2/2016 | Kim et al. | |
| 2017/0156131 A1 * | 6/2017 | Kimura | H04J 11/00 |
| 2017/0230138 A1 * | 8/2017 | Xiong | H04L 1/0003 |
| 2017/0251517 A1 | 8/2017 | Kimura et al. | |
| 2017/0257873 A1 | 9/2017 | Furuichi et al. | |
| 2017/0303274 A1 | 10/2017 | He et al. | |
| 2018/0041988 A1 * | 2/2018 | Lee | H04W 56/00 |
| 2018/0049065 A1 | 2/2018 | Yoon et al. | |
| 2018/0146445 A1 | 5/2018 | Lee et al. | |
| 2018/0227903 A1 * | 8/2018 | Uchiyama | H04W 72/04 |
| 2018/0324816 A1 * | 11/2018 | Islam | H04L 5/0048 |

FOREIGN PATENT DOCUMENTS

| | | |
|---|---|---|
| EP | 2068480 A1 | 6/2009 |
| EP | 2717478 A1 | 4/2014 |
| JP | 5084051 B1 | 11/2012 |
| JP | 2012-253600 A | 12/2012 |
| JP | 2013-123158 A | 6/2013 |
| WO | 2008/029845 A1 | 3/2008 |
| WO | 2012/165424 A1 | 12/2012 |
| WO | 2014/153737 A1 | 10/2014 |

OTHER PUBLICATIONS

Sharma et al., "Performance Survey of IDMA with different Interleavers," 2014 International Conference on Signal Processing and Integrated Networks (SPIN), 2014, pp. 344-348.

Office Action for CN Patent Application No. 201580057234.2, dated Jun. 1, 2018, 10 pages of Office Action and 21 pages of English Translation.

Yoshizawa, et al., "Hardware Implementation of an Interference Canceller for IDMA Wireless Communications", IEEE, 2013, 645-650 pages.

Sharma, et al., "Performance Survey of IDMA with different Interleavers", International Conference on Signal Processing and Integrated Networks (SPIN), IEEE, 2014, 344-348 pages.

Extended European Search Report for EP Patent Application No. 15855200.0, dated Jul. 10, 2018, 10 pages.

Ritt, et al, "Text Proposal on IDMA for Inter-Cell Interference Mitigation", TR 25.814, 3GPP TSG-RAN WG1#42 RI-050783, Aug. 29-Sep. 2, 2005, 17 pages.

International Search Report and Written Opinion of PCT Application No. PCT/JP2015/071689, dated Oct. 6,2015, 09 pages of English Translation and 07 pages of ISRWO.

International Preliminary Report on Patentability of PCT Application No. PCT/JP2015/071689, dated May 11, 2017, 09 pages of English Translation and 05 pages of IPRP.

Notice of Allowance and Fees Due for U.S. Appl. No. 15/520,004, dated Jun. 12, 2018, 12 pages.

Non-Final Rejection for U.S. Appl. No. 15/520,004, dated Feb. 8, 2018, 22 pages.

Office Action for CN Patent Application No. 201580057234.2, dated Feb. 2, 2019, 08 pages of Office Action and 38 pages of English Translation.

Office Action for JP Patent Application No. 2016-556393, dated Mar. 5, 2019, 04 pages of Office Action and 05 pages of English translation.

"Text Proposal on IDMA for "Inter-Cell Interference Mitigation" in TR 25.814", 3GPP TSG RAN WG1 #42, London, UK, R1-050783, Aug. 29-Sep. 2, 2005, 17 pages.

Yoshizawa, et al., "Hardware Implementation of Interference Canceller for IDMA Wireless Systems", IEICE Technical Report, vol. 113, No. 93, Jun. 13, 2013, pp. 91-96.

* cited by examiner

COMMUNICATION CONTROL APPARATUS, RADIO COMMUNICATION APPARATUS, COMMUNICATION CONTROL METHOD, AND RADIO COMMUNICATION METHOD

CROSS-REFERENCE TO RELATED APPLICATIONS

The present application is a continuation application of U.S. patent application Ser. No. 15/520,004, filed Apr. 18, 2017, which is a National Stage Entry of PCT/JP2015/071689, filed Jul. 30, 2015, and claims the benefit of priority from prior Japanese Patent Application JP 2014-218937, filed Oct. 28, 2014, the entire content of which is hereby incorporated by reference.

TECHNICAL FIELD

The present disclosure relates to a communication control apparatus, a radio communication apparatus, a communication control method, a radio communication method, and a program.

BACKGROUND ART

The number of users in cellular systems has significantly increased. Accordingly, systems of 5th Generation have been increasingly demanded. Shifting from 4th Generation to 5th Generation demands some breakthroughs (e.g., improvement of both spectral efficiency and energy efficiency, and advanced radio frequency domain processing). In terms of improving spectral efficiency, a multiple access technology (MAT) is an important element. As multiple access technologies, interleave division multiple access (IDMA), filter bank multicarrier (FBM), non-orthogonal multiple access (NOMA), and the like have been under study. Particularly in an IDMA system, interleavers make it possible to distinguish between different users and effectively eliminate interference between the users. The design of interleavers is one of the most important elements in an IDMA system, and technologies for achieving an appropriate design of interleavers have been developed.

For example, Patent Literature 1 below discloses a technology of performing transmission power control together with selection of an interleave pattern in order to eliminate interference between the users more effectively.

CITATION LIST

Patent Literature

Patent Literature 1: JP 2013-123158A

DISCLOSURE OF INVENTION

Technical Problem

In the technical field related to IDMA, however, a further improvement in performance is desired. Hence, the present disclosure provides a novel and improved communication control apparatus, radio communication apparatus, communication control method, radio communication method, and program that are capable of contributing to improving a radio communication technology related to IDMA.

Solution to Problem

According to the present disclosure, there is provided a communication control apparatus including: a communication unit configured to communicate with a radio communication apparatus of a radio communication system using interleave division multiple access (IDMA); and a control unit configured to allocate an interleaver type of an interleaver to be used for IDMA by the radio communication apparatus.

According to the present disclosure, there is provided a radio communication apparatus including: a radio communication unit configured to perform radio communication using IDMA with a base station; and a control unit configured to control the radio communication unit to perform interleave processing for IDMA by using an interleaver of an allocated interleaver type.

According to the present disclosure, there is provided a communication control method including: communicating with a radio communication apparatus of a radio communication system using interleave division multiple access (IDMA); and allocating, by a processor, an interleaver type of an interleaver to be used for IDMA by the radio communication apparatus.

According to the present disclosure, there is provided a radio communication method including: performing radio communication using IDMA with a base station; and performing control by a processor to perform interleave processing for IDMA by using an interleaver of an allocated interleaver type.

According to the present disclosure, there is provided a program causing a computer to function as: a communication unit configured to communicate with a radio communication apparatus of a radio communication system using interleave division multiple access (IDMA); and a control unit configured to allocate an interleaver type of an interleaver to be used for IDMA by the radio communication apparatus.

According to the present disclosure, there is provided a program causing a computer to function as: a radio communication unit configured to perform radio communication using IDMA with a base station; and a control unit configured to control the radio communication unit to perform interleave processing for IDMA by using an interleaver of an allocated interleaver type.

Advantageous Effects of Invention

According to the present disclosure, it is possible to contribute to improving a radio communication technology related to IDMA.

Note that the effects described above are not necessarily limitative. With or in the place of the above effects, there may be achieved any one of the effects described in this specification or other effects that may be grasped from this specification.

MODE(S) FOR CARRYING OUT THE INVENTION

Hereinafter, preferred embodiments of the present disclosure will be described in detail with reference to the appended drawings. Note that, in this specification and the appended drawings, structural elements that have substantially the same function and structure are denoted with the same reference signs, and repeated explanation of these structural elements is omitted.

Note that, in this specification and the appended drawings, elements that have substantially the same function and structure are sometimes distinguished from each other using different alphabets after the same reference sign. For example, if necessary, elements that have substantially the same function and structure (e.g., terminal apparatuses 200A and 200B) are distinguished from each other. However, when it is not particularly necessary to distinguish elements that have substantially the same function and structure, the same reference sign alone is attached. For example, when it is not particularly necessary to distinguish the terminal apparatuses 200A and 200B from each other, each apparatus is simply called a terminal apparatus 200.

Description is given in the following order.
1. Introduction
1-1. IDMA
1-2. Interleaver type
1-3. Overview of radio communication system
2. Example configuration
2-1. Example configuration of base station
2-2. Example configuration of terminal apparatus
2-3. Example configuration of communication control apparatus
3. Operation processing
3-1. Uplink communication
3-2. Downlink communication
4. Application examples
5. Conclusion

1. INTRODUCTION

[1-1. IDMA]

First, technologies related to IDMA are described with reference to FIGS. 1 to 4. FIGS. 1 to 4 are explanatory diagrams for describing the technologies related to IDMA.

Non-orthogonal multiple access has been attracting attention as one of 5G radio access technologies following long term evolution (LTE)/LTE-advanced (LTE-A).

In orthogonal frequency division multiple access (OFDMA) or single-carrier FDMA (SC-FDMA) adopted in LTE, radio resources are allocated so as not to overlap between user terminals within a cell. Note that radio resources are resources of frequency or time for radio communication, which include various types such as a resource block, a subframe, and a resource element. Such a radio access technology of allocating radio resources so that they do not overlap is also called orthogonal multiple access.

Figure 1:
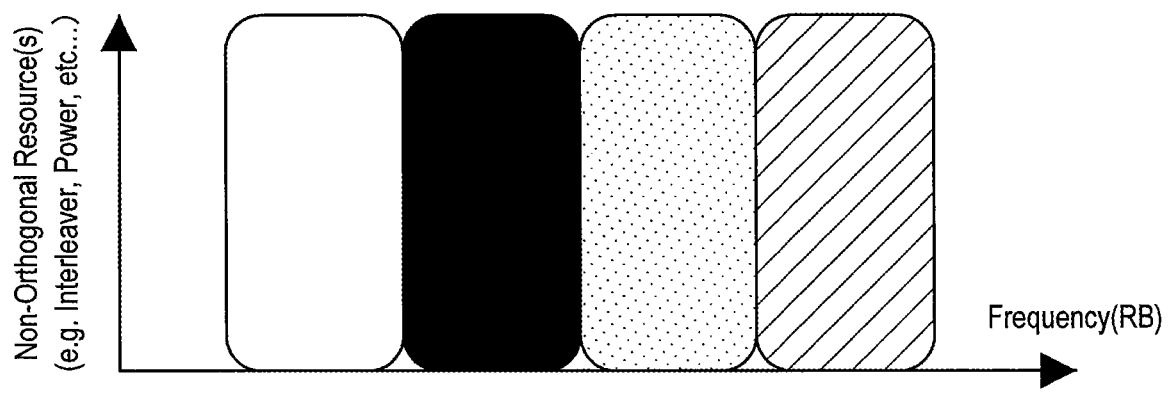
FIG. 1 is an explanatory diagram for describing a technology related to IDMA.

Here, FIG. 1 illustrates an example of allocation of radio resources in orthogonal multiple access. In FIG. 1, the horizontal axis indicates frequency, and radio resources allocated to different users are shown by different colors. As illustrated in FIG. 1, resource blocks (RBs) different in the frequency direction, for example, can be allocated to users in orthogonal multiple access.

In contrast, in non-orthogonal multiple access, at least partly overlapping radio resources are allocated to user terminals within a cell. In the case where non-orthogonal multiple access is adopted, signals transmitted and received by user terminals within a cell can interfere with each other in a wireless space. The receiving side, however, is able to acquire information for each user through predetermined decoding processing. It is theoretically known that non-orthogonal multiple access achieves higher communication capability (or cell communication capability) than orthogonal multiple access when the allocation of radio resources is executed appropriately.

Figure 2:
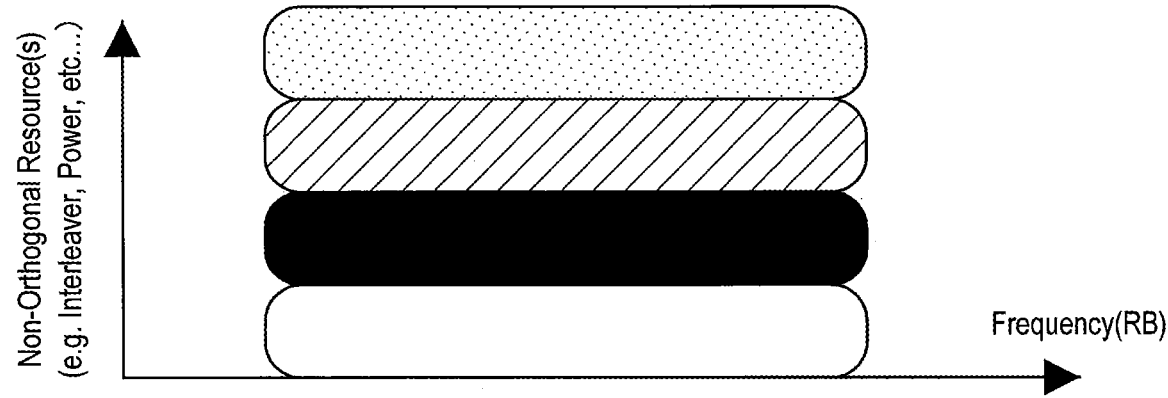
FIG. 2 is an explanatory diagram for describing a technology related to IDMA.

Here, FIG. 2 illustrates an example of allocation of radio resources in non-orthogonal multiple access. In FIG. 2, the horizontal axis indicates frequency, and radio resources allocated to different users are shown by different colors. As illustrated in FIG. 2, resource blocks overlapping in the frequency direction, for example, can be allocated to users in non-orthogonal multiple access.

IDMA is one of radio access technologies categorized as non-orthogonal multiple access. In IDMA, to identify user signals, different interleave patterns, which are used for interleave processing that a transmitting-side apparatus executes on transmission signals, are allocated to different users. A receiving-side apparatus decodes user signals separately by using de-interleave patterns corresponding to the interleave patterns allocated to the respective users. An advantage of IDMA is a light load of signal processing by the transmitting-side apparatus. This advantage is particularly emphasized in uplink (UL) from a user terminal to a base station.

Figure 3:
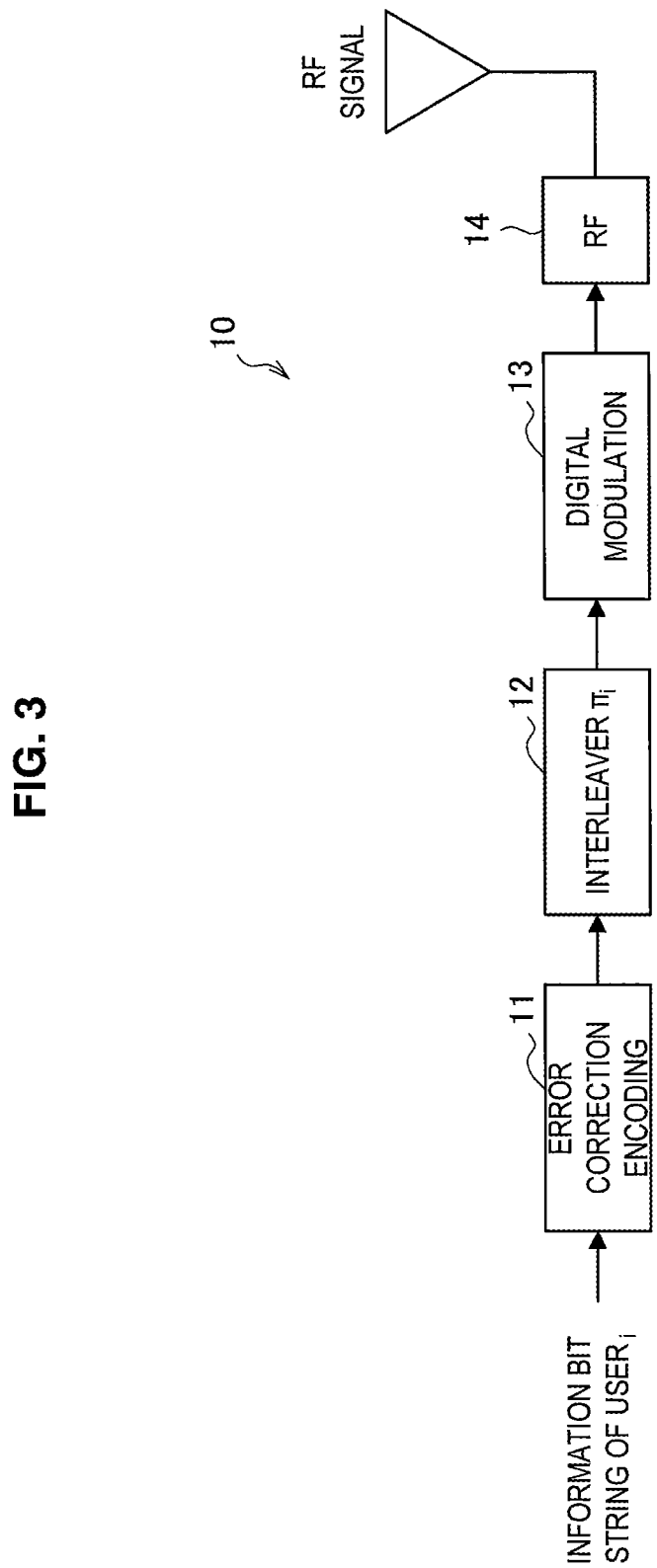
FIG. 3 is an explanatory diagram for describing a technology related to IDMA.

Here, FIG. 3 illustrates a basic example configuration of a transmitting station 10 that performs radio communication using IDMA. As illustrated in FIG. 3, the transmitting station 10 includes an error correction encoding circuit 11, an interleaver ($\pi_i$) 12, a digital modulation circuit 13, and a radio frequency (RF) circuit 14. The error correction encoding circuit 11 performs error correct encoding on an information bit string of a user i. The interleaver ($\pi_i$) 12, which is an interleaver for which an interleaver setting for the user i is made, performs interleave processing on the information bit string that has been subjected to error correction encoding. The digital modulation circuit 13 digitally modulates the information bit string that has gone through interleave processing. The RF circuit 14 performs various kinds of signal processing on a signal after digital modulation, and transmits a radio signal via an antenna. Note that an interleaver setting is a setting related to at least one of an interleaver type and an interleave pattern.

Figure 4:
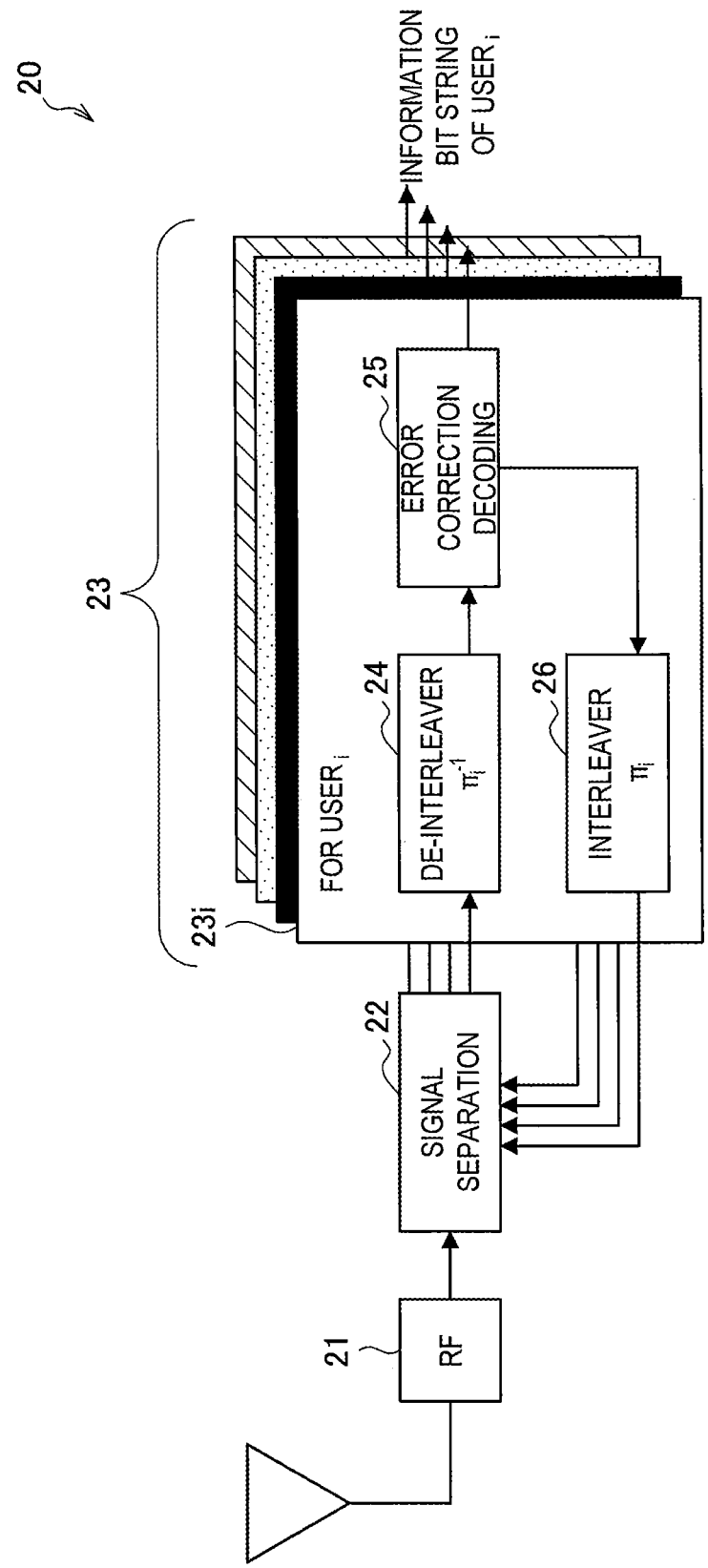
FIG. 4 is an explanatory diagram for describing a technology related to IDMA.

FIG. 4 illustrates a basic example configuration of a receiving station 20 that performs radio communication using IDMA. As illustrated in FIG. 4, the receiving station 20 includes an RF circuit 21, a signal separation circuit 22, and decoding circuits 23. The RF circuit 21 performs various kinds of signal processing on a radio signal received by an antenna, and outputs the resulting signal to the signal separation circuit 22. The signal separation circuit 22 has a function of separating a composite signal, in which signals from users are combined, into signals for the respective users, and outputs each user signal obtained by the separation to the corresponding decoding circuit 23. For example, the decoding circuit 23$i$ includes a de-interleaver ($\pi_i^{-1}$) 24 for which a de-interleaver setting for a user i is made, an error correction decoding circuit 25, and an interleaver ($\pi_i$) 26 for which an interleaver setting for the user i is made. The decoding circuit 23$i$, to which a user signal from the user i is input, performs de-interleave processing by the de-interleaver ($\pi_i^{-1}$) 24 and decoding by the error correction decoding circuit 25. The decoding circuit 23$i$ outputs the decoded signal as an information bit string of the user i when decoding has been performed correctly. In addition, the decoding circuit 23$i$ performs interleave processing by the interleaver ($\pi_i$) 26 on the decoded signal, and returns the resulting signal as a user signal for the user i to the signal separation circuit 22. Such returning of a user signal is performed for all the user signals. The signal separation circuit 22 performs signal separation again using returned user signals, and outputs user signals after the separation to the decoding circuits 23 again. The receiving station 20 repeats the signal processing by the signal separation circuit 22 and the decoding circuits 23, thereby decoding user signals. Such decoding of user signals from a multiple signal is also called multi user detection below.

In IDMA, for the receiving side to perform multi user detection, it is preferred to provide a mechanism in which the receiving side efficiently regenerates an interleave pattern generated at the transmitting side. In particular, it is preferred to provide a mechanism in which a small amount of memory is needed at the receiving side and a small amount of signaling is exchanged between the transmitting side and the receiving side.

[1-2. Interleaver Type]

IDMA involves various interleaver types. An interleaver type, which means a type of interleaver, is a policy of an interleave pattern used by an interleaver. Correlation characteristics are maintained between interleave patterns of the same interleaver type. In contrast, correlation characteristics are unknown between interleave patterns of different interleaver types. Therefore, it is preferred to allocate different interleave patterns of the same interleaver type for users between which interference can occur.

Main parameters that define an interleaver type are as follows. Reproducibility means difficulty in reproducing an interleaver used by the transmitting side at the receiving side, for example.

Interleaver characteristics
Correlation characteristics
Number of interleavers
Reproducibility
Computational complexity
Consumption of memory
Signaling overhead Table 1 below shows a list of main interleaver types discussed in papers and the like.

TABLE 1

| Interleaver | BER | Complexity | Memory | Bandwidth | Inter-correlation |
|---|---|---|---|---|---|
| Orthogonal interleaver | Similar performance with that of random interleaver, limited by the number of users | Slow generation | Stock initial master interleaver | Transfer initial master interleaver | Orthogonal |
| Pseudo-Random interleaver | | Considerable delay | Stock all the primitive polynomial | No extra bandwidth consumption | Low |
| Nested interleaver | | Slow generation in a recursive way | Stock initial master and intermediate interleaver | Transfer initial master interleaver | Low |
| Cyclically shifted multiple interleaver | As good as that of random interleaver, but limited by the number of users | The way of generation is complex and less efficient | Need a lot of memory because of the large size of interleaver | Transfer the "common interleaver" | Decorrelated |
| Deterministic interleaver | | Fast generation | No master interleaver needed | No extra information exchanged | Some users may have the same interleaver |

TABLE 1-continued

| Interleaver | BER | Complexity | Memory | Bandwidth | Inter-correlation |
|---|---|---|---|---|---|
| Power interleaver | Similar to the performance of random interleaver | High delay to generate interleaver | Stock initial master interleaver | Transfer initial master interleaver | Correlation may exist because each interleaver is generated by its previous one |
| Helical interleaver | As good as random and other interleaver (PN, cyclical, power) | Very fast generation | Stock initial master interleaver | Transfer initial master interleaver | Low Correlation |
| Linear congruential interleaver | As good as random interleaver, and even better than it when user number increases | Fast generation | Stock initial master interleaver | Transfer initial master interleaver | Low Correlation |

As shown in Table 1, different interleaver types differ in characteristics and reproducibility. Note that in Table 1, reproducibility is shown as complexity, memory, and bandwidth.

[1-3. Overview of Radio Communication System]

Figure 5:
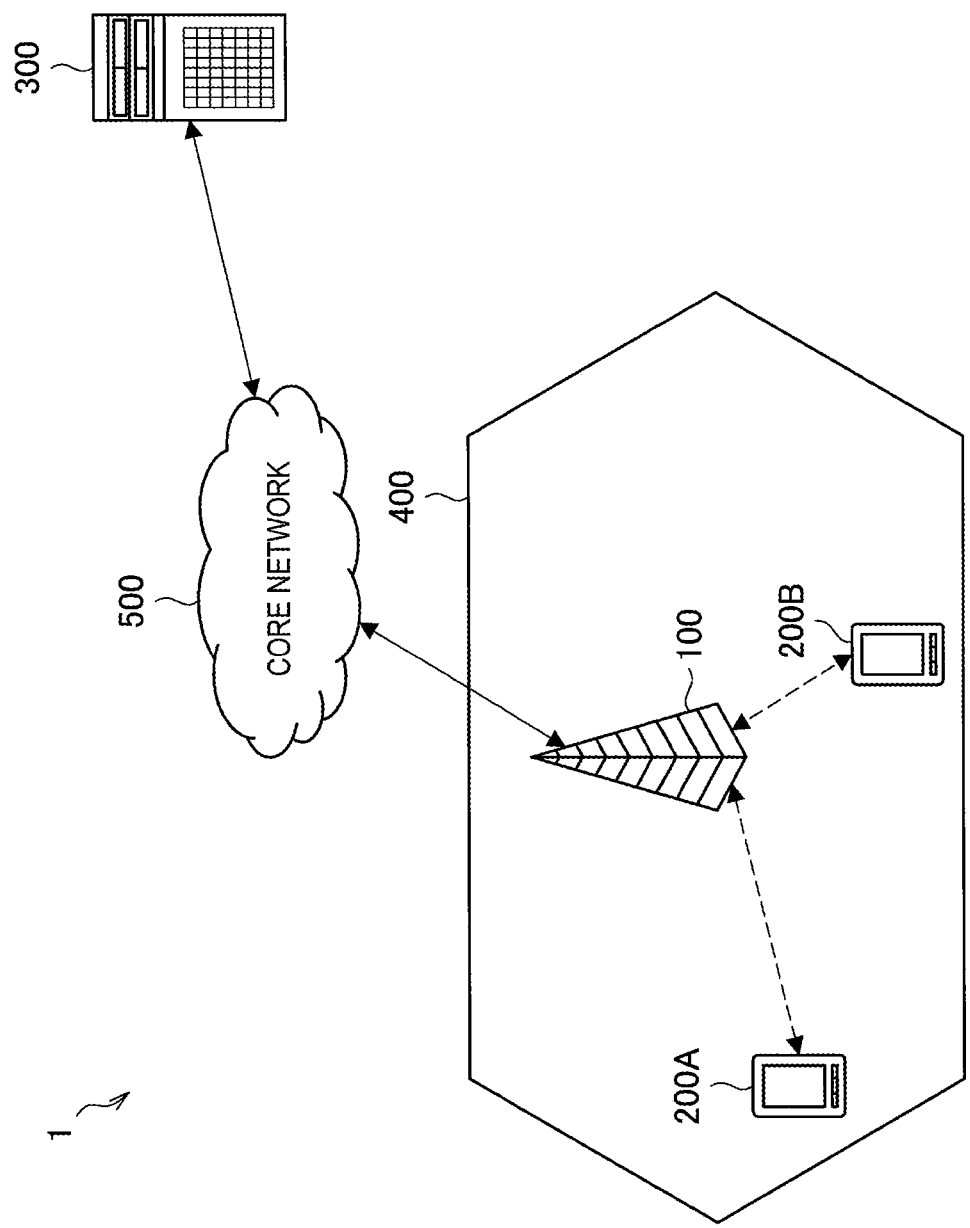
FIG. 5 is an explanatory diagram for describing an overview of a radio communication system according to an embodiment of the present disclosure.

FIG. 5 is an explanatory diagram for describing an overview of a radio communication system according to an embodiment of the present disclosure. As illustrated in FIG. 5, a radio communication system 1 according to the present embodiment includes a base station 100, a terminal apparatus 200, a communication control apparatus 300, and a core network 500.

The base station 100 is a radio communication apparatus that provides a radio communication service for one or more terminal apparatuses 200 located inside a cell 400, and transmits and receives data to/from the terminal apparatuses 200. For example, the base station 100 is an evolutional Node B (eNB) or an access point in a cellular system. The base station 100 is connected to the core network 500. The core network 500 is connected to a packet data network (PDN) via a gateway apparatus. The cell 400 may be operated in accordance with any radio communication scheme, such as long term evolution (LTE), LTE-advanced (LTE-A), GSM (registered trademark), UMTS, W-CDMA, CDMA2000, WiMAX, WiMAX2, or IEEE802.16.

The terminal apparatus 200 is a radio communication apparatus that is provided with the radio communication service by the base station 100, and transmits and receives data to/from the base station 100. For example, the terminal apparatus 200 is a user terminal (user equipment (UE)) in a cellular system.

The communication control apparatus 300 is an apparatus that coordinately controls radio communication by the base station 100 and the terminal apparatus 200. In the example illustrated in FIG. 5, the communication control apparatus 300 is a server. Without being limited to the example illustrated in FIG. 5, for example, the communication control apparatus 300 may be a function implemented by one of a macro cell, a small cell cluster, and a small cell, or may be realized as any apparatus (physical apparatus or logical apparatus) within the core network 500.

The purpose of interleave performed in IDMA is to randomize interference between users. An interleave pattern selected at the transmitting side is preferably an interleave pattern that makes correlation characteristics with respect to other users closer to decorrelation. However, in uplink communication, in the case where the terminal apparatus 200 selects an interleave pattern to use by itself, it may be difficult to maintain favorable correlation characteristics (decorrelation) between terminal apparatuses 200. For example, in the case where terminal apparatuses 200 select interleave patterns in high correlation with each other, interference may occur, which may make it difficult to decode signals from the terminal apparatuses 200 in the base station 100 serving as the receiving side. Such interference may occur noticeably in the case where the terminal apparatus 200 is positioned at a cell boundary.

Figure 6:
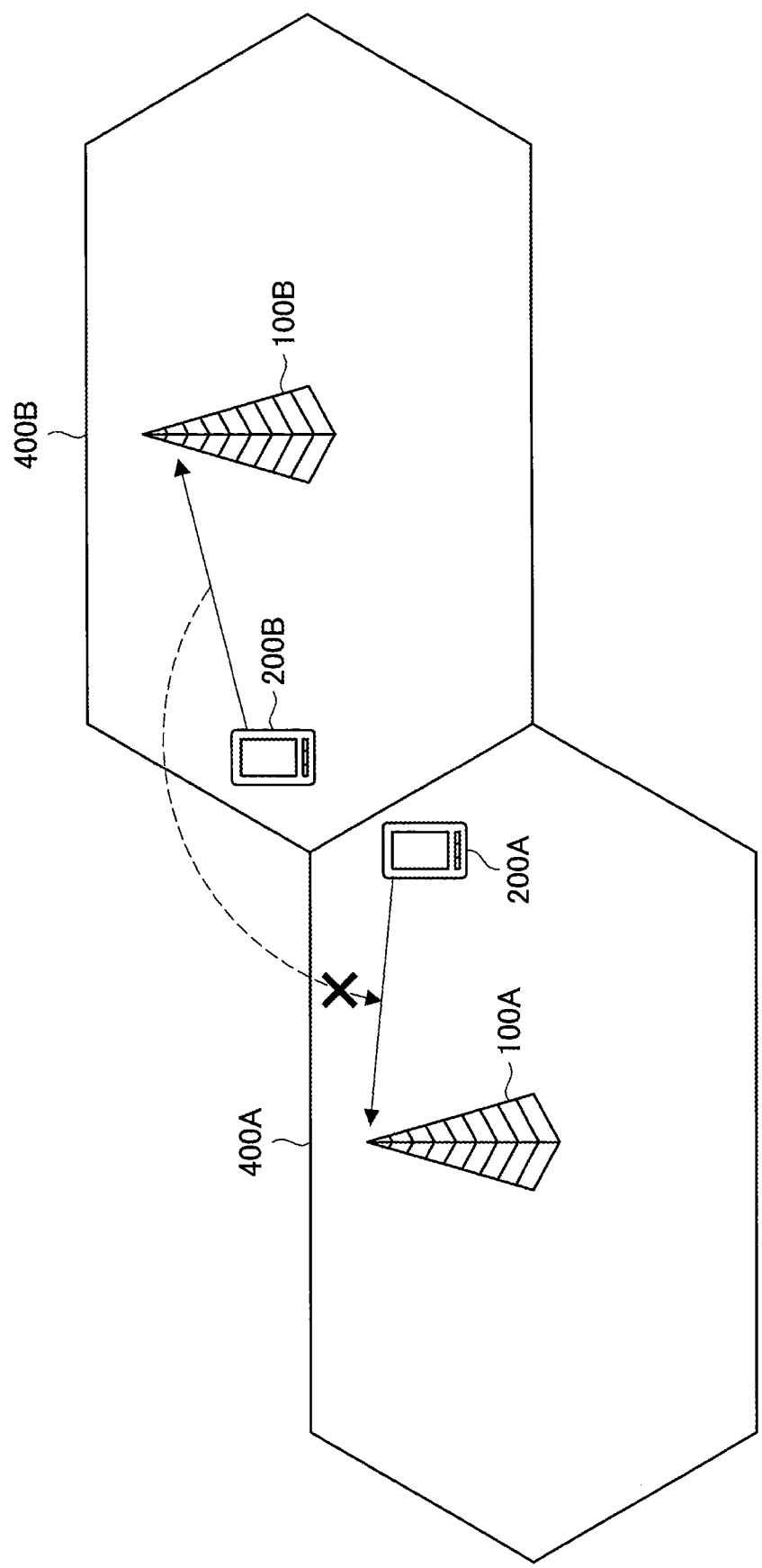
FIG. 6 is an explanatory diagram for describing an example of inter-cell interference in uplink communication.

FIG. 6 is an explanatory diagram for describing an example of inter-cell interference in uplink communication. In the example illustrated in FIG. 6, the base station 100A communicates with the terminal apparatus 200A, and the base station 100B communicates with the terminal apparatus 200B. The terminal apparatuses 200A and 200B are positioned at cell edges of the cells 400A and 400B. In such a positional relation, for example, uplink traffic transmitted by the terminal apparatus 200B to the base station 100B may cause interference with uplink traffic transmitted by the terminal apparatus 200A to the base station 100A. Needless to say, such interference may occur similarly in downlink communication as well. In IDMA communication, a mechanism that reduces such inter-cell interference is preferably provided. Hence, in the present embodiment, the communication control apparatus 300 allocates interleave patterns to be used by the terminal apparatuses 200, thereby avoiding such interference.

On the other hand, in 5G, multiple radio access technology (RAT) and multiple layer network have been under study, and various radio access technologies and architectures may coexist. In such a network, high flexibility is preferably achieved. Here, IDMA communication involves various types of interleavers, as shown in Table 1. To achieve high flexibility demanded in 5G, a mechanism in which various types of interleavers are available is preferably provided. Hence, in the present embodiment, the communication control apparatus 300 allocates interleaver types to be used by the terminal apparatuses 200, thereby achieving high flexibility. In the description below, allocation of at least one of an interleaver type and an interleave pattern to be used by the terminal apparatus 200 by the communication control apparatus 300 is also called allocation of an interleaver.

2. EXAMPLE CONFIGURATION

Now, example configurations of the base station 100, the terminal apparatus 200, and the communication control apparatus 300 according to the present embodiment will be described with reference to FIGS. 7 to 10.

[2-1. Example Configuration of Base Station]

Figure 7:
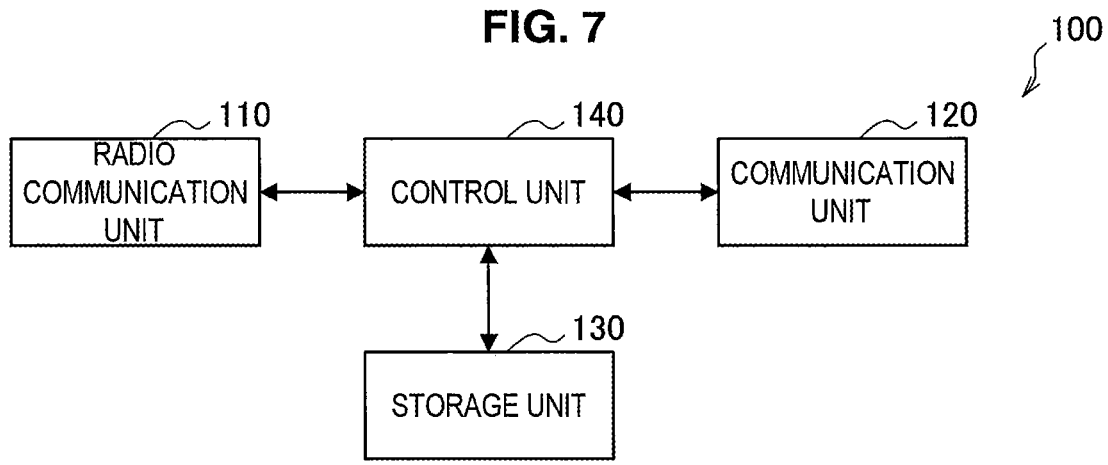
FIG. 7 is a block diagram illustrating an example of a logical configuration of a base station according to the present embodiment.

FIG. 7 is a block diagram illustrating an example of a logical configuration of the base station 100 according to the present embodiment. As illustrated in FIG. 7, the base station 100 includes a radio communication unit 110, a communication unit 120, a storage unit 130, and a control unit 140.

(1) Radio Communication Unit 110

The radio communication unit 110 is a communication interface via which the base station 100 communicates with other apparatuses. The radio communication unit 110 according to the present embodiment has a function of performing radio communication using IDMA with the terminal apparatus 200. The radio communication unit 110 may transmit and receive control information to/from the terminal apparatus 200. For example, the base station 100 transmits information indicating an interleaver allocated by the communication control apparatus 300 to the terminal apparatus 200. As will be described later, in uplink communication, there is a case where the terminal apparatus 200 serving as the transmitting side selects (allocates) an interleave pattern. In that case, the radio communication unit 110 receives information indicating an interleave pattern to be used by the terminal apparatus 200 from the terminal apparatus 200.

(2) Communication Unit 120

The communication unit 120 is a communication interface via which the base station 100 communicates with other apparatuses. The communication unit 120 according to the present embodiment transmits and receives data to/from the communication control apparatus 300 by wire or wirelessly. For example, the communication unit 120 transmits information needed by the communication control apparatus 300 for interleaver allocation processing to the communication control apparatus 300, and receives information indicating an allocated interleaver.

(3) Storage Unit 130

The storage unit 130 has a function of storing various kinds of information. For example, the storage unit 130 stores information indicating an interleaver allocated by the communication control apparatus 300.

(4) Control Unit 140

The control unit 140 functions as an arithmetic processing apparatus and a control apparatus, and controls the whole operation within the base station 100 in accordance with various programs.

Uplink communication

For example, the control unit 140 has a function of controlling reception processing by the radio communication unit 110 in uplink communication.

For example, the control unit 140 controls the radio communication unit 110 to perform multi user detection in accordance with an interleaver allocated to the terminal apparatus 200 serving as the transmitting side, and decode a user signal transmitted by the terminal apparatus 200. Note that information indicating an interleaver type allocated to the terminal apparatus 200 is reported from the communication control apparatus 300. Information indicating an interleave pattern allocated to the terminal apparatus 200 is reported from the communication control apparatus 300 in the case where the communication control apparatus 300 has performed the allocation, and is reported from the terminal apparatus 200 in the case where the terminal apparatus 200 has performed the allocation. The control unit 140 controls the radio communication unit 110 to report an ACK signal (acknowledgment) or a NACK signal (negative acknowledgment) to the terminal apparatus 200 serving as the transmitting side, depending on whether the decoding of the user signal is successful or unsuccessful.

Downlink communication

For example, the control unit 140 has a function of controlling transmission processing by the radio communication unit 110 in downlink communication. Description on this function is similar to description on the terminal apparatus 200 in uplink communication, which is given below; therefore, detailed description is omitted here.

The example configuration of the base station 100 according to the present embodiment has been described above.

[2-2. Example Configuration of Terminal Apparatus]

Figure 8:
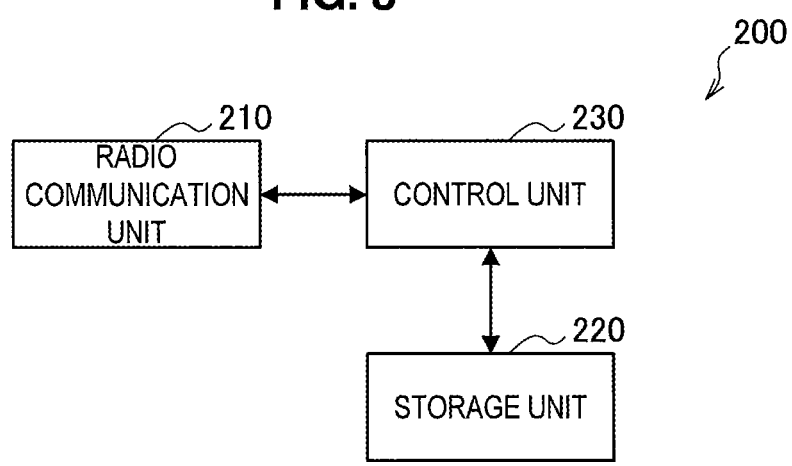
FIG. 8 is a block diagram illustrating an example of a logical configuration of a terminal apparatus according to the present embodiment.

FIG. 8 is a block diagram illustrating an example of a logical configuration of the terminal apparatus 200 according to the present embodiment. As illustrated in FIG. 8, the terminal apparatus 200 includes a radio communication unit 210, a storage unit 220, and a control unit 230.

(1) Radio Communication Unit 210

The radio communication unit 210 is a communication interface via which the terminal apparatus 200 communicates with other apparatuses. The radio communication unit 210 according to the present embodiment has a function of performing radio communication using IDMA with the base station 100. The radio communication unit 210 may transmit and receive control information to/from the base station 100. For example, the radio communication unit 210 transmits a message requesting interleaver allocation to the base station 100. In the description below, this message is also called an IDMA request. The IDMA request may be a message requesting allocation of an interleaver type, or may be a message requesting allocation of an interleaver type and an interleave pattern. The IDMA request is transferred to the communication control apparatus 300 by the base station 100. Then, the radio communication unit 210 receives information indicating an interleaver allocated by the communication control apparatus 300 from the base station 100. In the description below, a message including information indicating an interleaver allocated by the communication control apparatus 300 is also called an IDMA response. The IDMA response includes information indicating an allocated interleaver type or information indicating an allocated interleaver type and interleave pattern. In the case where the terminal apparatus 200 selects an interleave pattern, the radio communication unit 210 transmits information indicating an interleave pattern to be used by the terminal apparatus 200 to the base station 100.

(2) Storage Unit 220

The storage unit 220 has a function of storing various kinds of information. For example, the storage unit 220 stores information indicating an interleaver allocated by the communication control apparatus 300.

(3) Control Unit 230

The control unit 230 functions as an arithmetic processing apparatus and a control apparatus, and controls the whole operation within the terminal apparatus 200 in accordance with various programs.

Uplink communication

For example, the control unit 230 has a function of controlling transmission processing by the radio communication unit 210 in uplink communication.

For example, the control unit 230 has a function of selecting an optimal communication scheme from a plurality of communication schemes. Specifically, the control unit 230 has a function of determining whether to perform signal transmission using IDMA. The control unit 230 may determine whether to perform signal transmission using IDMA, on the basis of a packet size of transmission data, uplink channel quality, a modulation and coding scheme (MCS) index, and the like. Note that the control unit 230 may select multiple access communication of a complex type, such as OFDM-IDMA. When determining to perform signal transmission using IDMA, the control unit 230 controls the radio communication unit 210 to transmit an IDMA request to the base station 100. In uplink communication, the terminal apparatus 200 transmits uplink control information (UCI) including a scheduling request to the base station 100. Similarly, the terminal apparatus 200 may transmit UCI including the IDMA request to the base station 100. Note that the determination of whether the terminal apparatus 200 performs signal transmission using IDMA may be performed by the communication control apparatus 300. In that case, the control unit 230 controls the radio communication unit 210 to transmit information such as a packet size of transmission data, uplink channel quality, and a MCS index to the communication control apparatus 300 via the base station 100.

For example, the control unit 230 controls interleave processing using an interleaver allocated by the communication control apparatus 300. Specifically, the control unit 230 controls the radio communication unit 210 to perform interleave processing for IDMA by using an interleaver of an interleaver type allocated by the communication control apparatus 300. Furthermore, the control unit 230 may control the radio communication unit 210 to perform interleave processing for IDMA by using an interleave pattern allocated by the communication control apparatus 300.

Instead of the allocation by the communication control apparatus 300, the control unit 230 itself may select an interleave pattern to be used for interleave processing performed by the radio communication unit 210. The control unit 230 can select (allocate) an interleave pattern by a method similar to that for the communication control apparatus 300. The method for interleave pattern allocation will be described later as description on the communication control apparatus 300; therefore, detailed description is omitted here.

In the case where the control unit 230 selects an interleave pattern, the control unit 230 controls the radio communication unit 210 to transmit a message including information indicating a selected interleave pattern to the base station 100 serving as the receiving side. This message may be included in UCI. Thus, the base station 100 serving as the receiving side can find the interleave pattern used at the transmitting side, and thus can perform multi user detection.

Downlink communication

For example, the control unit 230 has a function of controlling reception processing by the radio communication unit 210 in downlink communication. Description on this function is similar to description on the base station 100 in uplink communication; therefore, detailed description is omitted here.

The example configuration of the terminal apparatus 200 according to the present embodiment has been described above.

[2-3. Example Configuration of Communication Control Apparatus]

Figure 9:
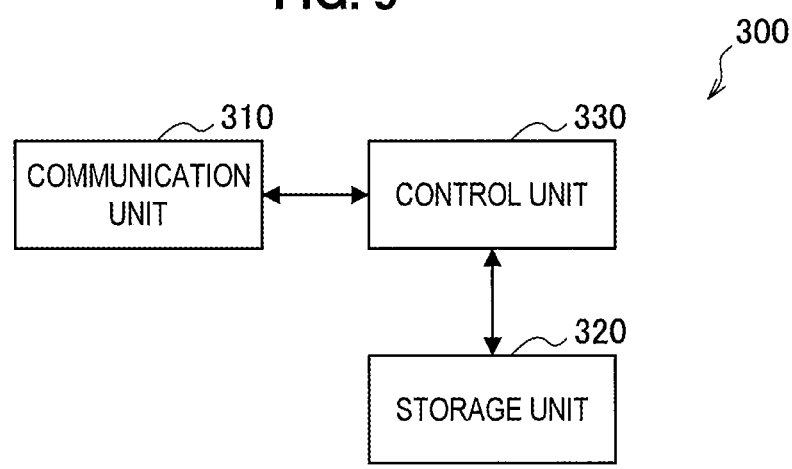
FIG. 9 is a block diagram illustrating an example of a logical configuration of a communication control apparatus according to the present embodiment.

FIG. 9 is a block diagram illustrating an example of a logical configuration of the communication control apparatus 300 according to the present embodiment. As illustrated in FIG. 9, the communication control apparatus 300 includes a communication unit 310, a storage unit 320, and a control unit 330.

(1) Communication Unit 310

The communication unit 310 is a communication interface via which the communication control apparatus 300 communicates with other apparatuses. For example, the communication unit 310 communicates with a radio communication apparatus of the radio communication system 1 using IDMA. The communication unit 310 according to the present embodiment directly or indirectly transmits and receives data to/from the base station 100 or the terminal apparatus 200, which performs transmission or reception using IDMA.

For example, the communication unit 310 receives an IDMA request from the radio communication apparatus (the base station 100 or the terminal apparatus 200). This reception of the IDMA request serves as a trigger for the control unit 330 to perform interleaver allocation. The communication unit 310 may receive information needed for allocation processing.

For example, the communication unit 310 transmits a message including information indicating an interleaver type allocated by the control unit 330 to the radio communication apparatus. In addition, the communication unit 310 transmits a message including information indicating an interleave pattern allocated by the control unit 330 to the radio communication apparatus. These pieces of information may be transmitted as one message, or may be transmitted separately; in this specification, the message is also called an IDMA response in both cases. When being transmitted from the base station 100 to the terminal apparatus 200, the IDMA response may be transmitted using, for example, a system information block (SIB) or downlink control information (DCI). More specifically, the IDMA response may be transmitted using a physical downlink control channel (PDCCH) or a physical broadcast channel (PBCH).

The communication control apparatus 300 may be identical to or independent of the base station 100 or the terminal apparatus 200. The identicalness/independence here includes logical identicalness/independence as well as physical identicalness/independence. The communication unit 310 performs transmission and reception to/from an independent apparatus via a wired or wireless communication circuit, and performs transmission and reception inside the apparatus for an identical apparatus.

(2) Storage Unit 320

The storage unit 320 has a function of storing various kinds of information. For example, the storage unit 320 stores information indicating interleavers allocated to the base stations 100 or the terminal apparatuses 200.

(3) Control Unit 330

The control unit 330 functions as an arithmetic processing apparatus and a control apparatus, and controls the whole operation within the communication control apparatus 300 in accordance with various programs.

For example, the control unit 330 has a function of coordinately controlling radio communication using IDMA in the radio communication system 1. Specifically, the control unit 330 allocates an interleaver type to a radio communication apparatus that is a transmission source of an IDMA request and serves as the data transmitting side. Furthermore, the control unit 330 may allocate an interleave pattern. Normally, a plurality of interleave patterns are generated when an input parameter for an interleaver type is changed; therefore, the control unit 330 allocates an interleave pattern by designating a parameter used for generation of an interleave pattern. Interleave pattern allocation may be performed by the radio communication apparatus of the data transmitting side. The allocation-target radio communication apparatus is the terminal apparatus 200 serving as the data transmitting side in uplink communication, and is the base station 100 serving as the data transmitting side in downlink communication. Interleaver type allocation and interleave pattern allocation are specifically described below.

(Interleaver Type Allocation)

For example, the control unit 330 allocates an interleaver type of an interleaver to be used for IDMA by the allocation-target radio communication apparatus. There are various methods for interleaver type allocation by the control unit 330. As examples of the methods, static interleaver type allocation and dynamic interleaver type allocation are described below.

Static interleaver type allocation (Semi-static allocation)

For example, the control unit 330 allocates an interleaver type on the basis of attribute information related to the radio communication apparatus. Examples of attribute information are shown below.

Capability
memory, complexity of calculation, etc.
Communication type
cellular, device to device (D2D), machine type communication (MTC), etc.
Deployment type
macro cell, small cell, femtocell, Phantom cell, distributed antenna system (DAS), etc.

The control unit 330 acquires attribute information, examples of which are shown above, from the base station 100 or the terminal apparatus 200, and uses the attribute information as a parameter for interleaver type allocation. Note that the communication type may depend on the amount of signaling information.

For example, in uplink communication, the control unit 330 allocates an interleaver type to be used by the terminal apparatus 200 in accordance with the capability of the terminal apparatus 200. Thus, the control unit 330 can allocate an interleaver type having favorable characteristics but having a large memory usage or high calculation complexity to a terminal apparatus 200 having a large amount of memory and high arithmetic capacity, for example.

For example, in uplink communication, the control unit 330 allocates an interleaver type to be used by the terminal apparatus 200 in accordance with the communication type of the terminal apparatus 200. Thus, the control unit 330 can allocate an interleaver type having a small amount of signaling for generation of an interleave pattern, for a communication type in which a small amount of signaling information is preferred, such as MTC, for example.

Static interleaver type allocation has been described above. Now, dynamic interleaver type allocation will be described.

Dynamic interleaver type allocation (Dynamic allocation)

For example, the control unit 330 allocates an interleaver type on the basis of a communication state related to the radio communication apparatus. Examples of a communication state are shown below.

Number of multiplexed users (e.g., number of multiplexed UEs)
Interleaver allocation situation of adjacent cell
Communication scheme
semi-static, dynamic
Packet retransmission or not, retransmission method
hybrid automatic repeat-request (HARQ)
Requested throughput
Requested quality of service (QoS)

The control unit 330 acquires information indicating a communication state, examples of which are shown above, from the base station 100 or the terminal apparatus 200, and uses the information as a parameter for interleaver type allocation.

For example, the control unit 330 dynamically allocates an interleaver type or changes allocation in accordance with the number of multiplexed UEs. Thus, the control unit 330 can allocate an interleaver type not having favorable correlation characteristics but allowing easy generation of an interleave pattern, in the case where the number of multiplexed UEs is small, for example.

For example, the control unit 330 dynamically allocates an interleaver type or changes allocation on the basis of the interleaver allocation situation of an adjacent cell. Thus, the control unit 330 can allocate an interleaver type in accordance with an interleaver type used in the adjacent cell so as to reduce inter-cell interference, for example. Interleaver type allocation in accordance with the interleaver allocation situation of an adjacent cell is described below with reference to FIG. 10.

Figure 10:
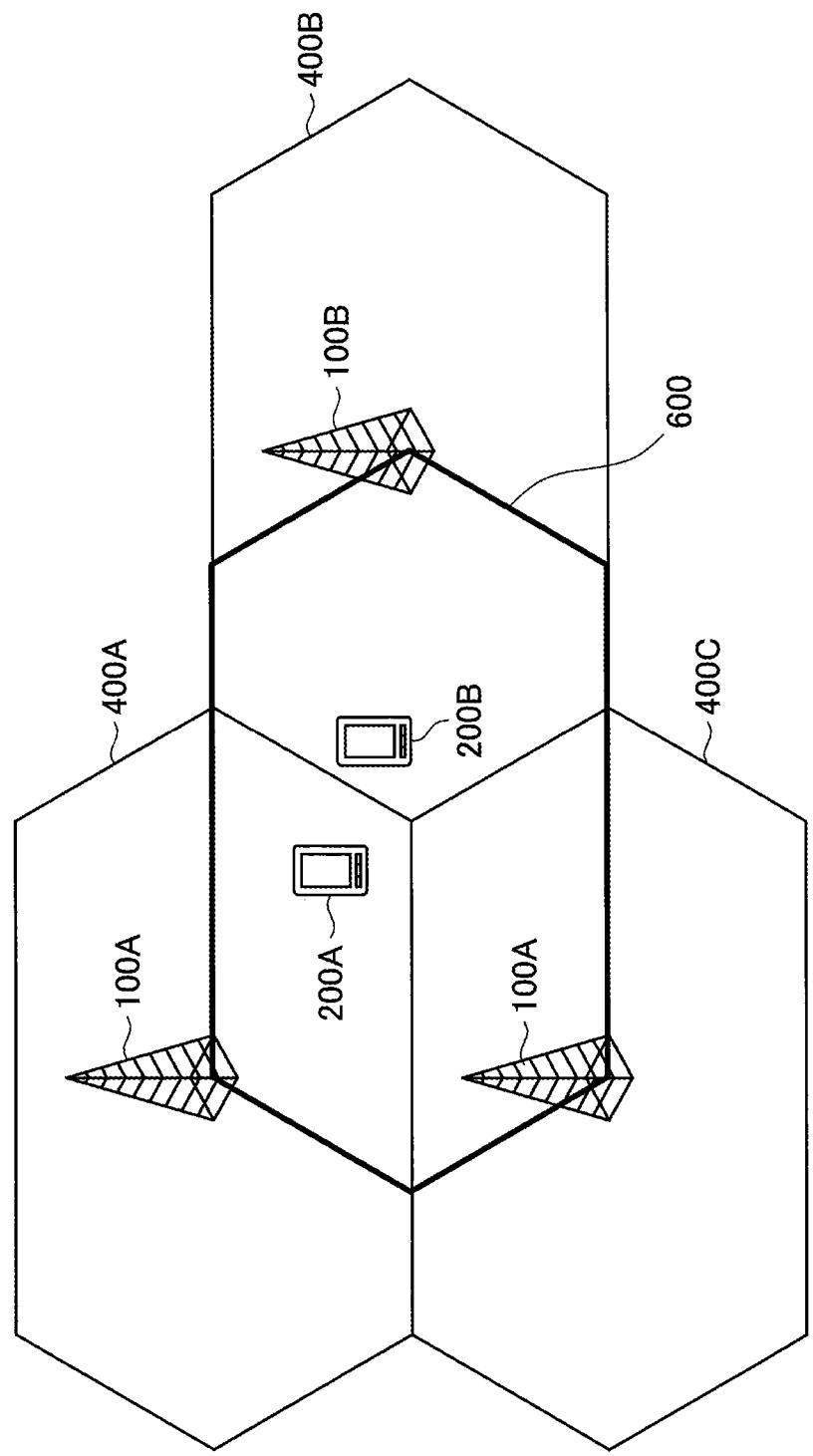
FIG. 10 is an explanatory diagram for describing an example of dynamic interleaver type allocation according to the present embodiment.

FIG. 10 is an explanatory diagram for describing an example of dynamic interleaver type allocation according to the present embodiment. In the example illustrated in FIG. 10, the cells 400A, 400B, and 400C operated by the base stations 100A, 100B, and 100C are adjacent to each other. In interleaver type allocation in accordance with the interleaver allocation situation of an adjacent cell, the control unit 330 first sets a management area. The management area may be set inside one cell, or may be set across a plurality of adjacent cells. In the example illustrated in FIG. 10, the control unit 330 sets a management area 600 across the cells 400A, 400B, and 400C. Then, the control unit 330 allocates the same interleaver type preferentially to radio communication apparatuses belonging to the set management area 600. Thus, the same interleaver type is allocated between adjacent cells. Since correlation characteristics are maintained between interleave patterns of the same interleaver type, inter-cell interference within the management area 600 can be suppressed.

Dynamic interleaver type allocation has been described above.

(Interleave Pattern Allocation)

The control unit 330 may allocate an interleave pattern to be used for IDMA by the allocation-target radio communication apparatus. For example, after performing the static or dynamic interleaver type allocation described above, the control unit 330 allocates an interleave pattern in the allocated interleaver type. The control unit 330 performs interleave pattern allocation using parameters shown below, for example.

Static parameters
Cell ID, virtual cell ID, global cell ID, communication point (transmission point) ID
Radio network temporary identifier (RNTI)
Offset (peculiar to the terminal apparatus 200)
System frame number (SFN), subframe index
Dynamic parameters
Data length, code block length, codeword length
Resource usage (resource block, resource element)
MCS index, CQI index, precoding matrix indicator (PMI), rank indicator (RI)
Number of multiplexed users (e.g., number of multiplexed UEs)
Initial master interleaver, common interleaver The control unit 330 may allocate different interleave patterns to radio communication apparatuses to which the same interleaver type is allocated. Thus, correlation characteristics are maintained between the radio communication apparatuses to which the same interleaver type is allocated, so that interference is avoided.

The control unit 330 controls the communication unit 310 to contain information indicating the allocated interleave pattern in an IDMA response, and transmit the IDMA response to the allocation-target radio communication apparatus. The information indicating the interleave pattern, which is to be contained in the IDMA response, may be a parameter used by the control unit 330 for interleave pattern allocation. The allocation-target radio communication apparatus can generate the allocated interleave pattern using the parameter contained in the IDMA response, and use the interleave pattern. Note that an interleave pattern is reproduced (generated) at a radio communication apparatus of the receiving side as well as a radio communication apparatus of the transmitting side.

In the case where a parameter used for interleave pattern allocation is included in existing control information etc. being signaled, the parameter is not necessarily included in the IDMA response. In that case, for example, the terminal apparatus 200 can combine a parameter included in the IDMA response with a parameter included in the control information to generate the allocated interleave pattern. The amount of signaling for reporting an interleave pattern is suppressed; thus, the overhead of the radio communication system 1 is suppressed. Examples of a parameter that may be included in existing control information etc. being signaled include a cell ID, a RNTI, a SFN, and a subframe index.

Such suppression of the amount of signaling for reporting an interleave pattern may be performed similarly also in the case where the terminal apparatus 200 allocates an interleave pattern. For example, when the terminal apparatus 200 serving as the transmitting side reports information indicating an interleave pattern allocated by the terminal apparatus 200 itself to the base station 100 serving as the receiving side, a parameter included in existing control information etc. being signaled may be omitted from parameters to be reported. In that case, for example, the base station 100 can combine a parameter received from the terminal apparatus 200 with a parameter included in the control information to generate the allocated interleave pattern.

Interleave pattern allocation has been described above.

In addition, in the case where the determination of whether to perform signal transmission using IDMA is not performed at the radio communication apparatus side, the control unit 330 may determine whether to permit signal transmission using IDMA by the radio communication apparatus. For example, the control unit 330 can determine whether to permit signal transmission using IDMA, on the basis of a packet size of transmission data transmitted by the radio communication apparatus, uplink channel quality, a MCS index, and the like. These pieces of information are received from the radio communication apparatus performing data transmission, together with or separately from an IDMA request. The control unit 330 may make the determination further on the basis of, in addition to these pieces of information acquired from the radio communication apparatus, information on another terminal apparatus 200 within the same cell as the radio communication apparatus or the IDMA execution situation of an adjacent cell, for example.

The example configuration of the communication control apparatus 300 according to the present embodiment has been described above.

3. OPERATION PROCESSING

Now, examples of operation processing of the radio communication system 1 according to the present embodiment will be described with reference to FIGS. 11 to 14.

[3-1. Uplink Communication]

Figure 11:
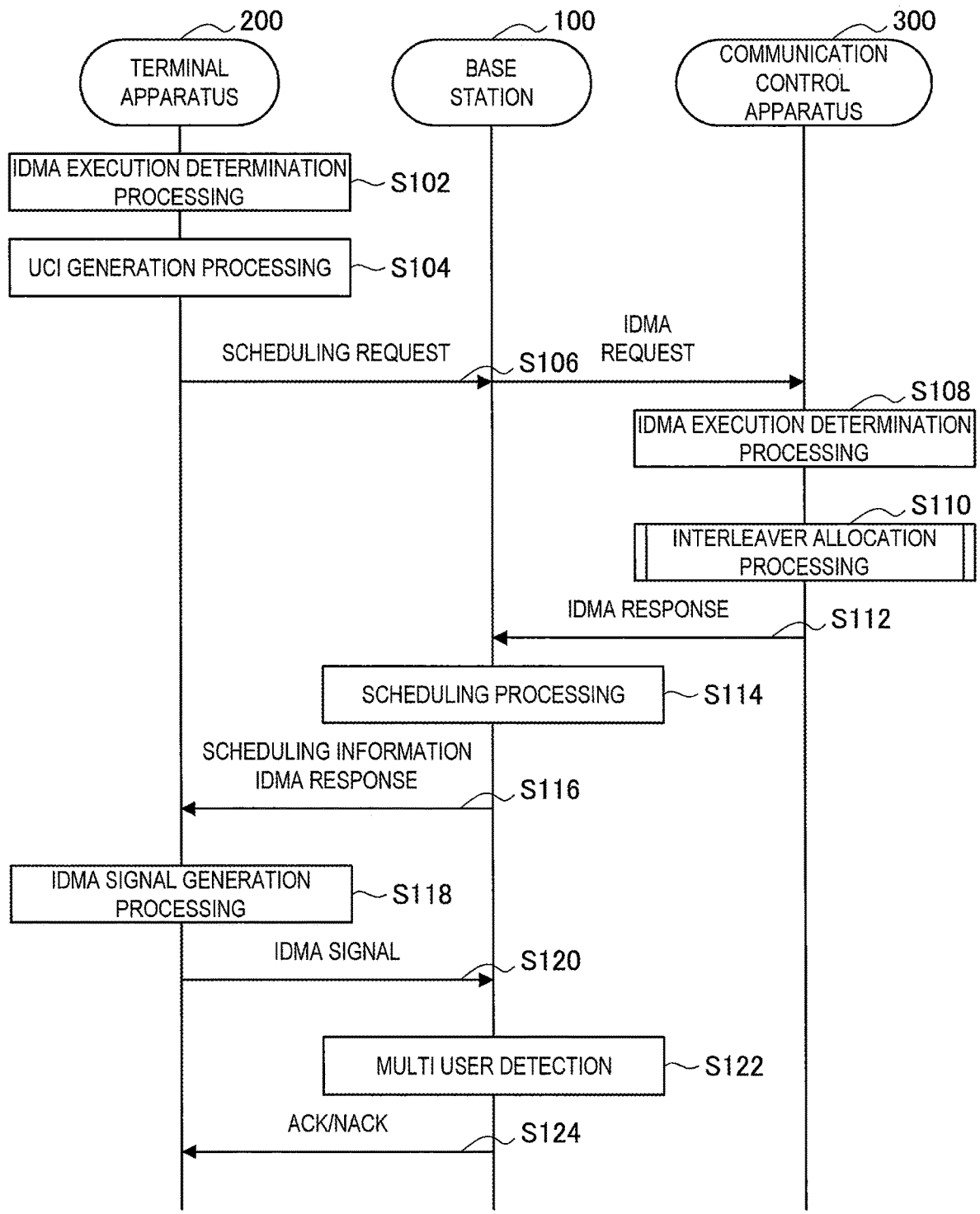
FIG. 11 is a sequence diagram illustrating an example of the flow of IDMA communication processing executed in the radio communication system according to the present embodiment.

FIG. 11 is a sequence diagram illustrating an example of the flow of IDMA communication processing executed in the radio communication system 1 according to the present embodiment. As illustrated in FIG. 11, this sequence involves the terminal apparatus 200, the base station 100, and the communication control apparatus 300.

First, in step S102, the terminal apparatus 200 performs IDMA execution determination processing. For example, the terminal apparatus 200 determines whether to perform signal transmission using IDMA, on the basis of a packet size of transmission data, uplink channel quality, a MCS index, and the like. In the case where IDMA execution determination processing is performed in step S108 described later, this step may be omitted.

Then, in step S104, UCI generation processing is performed. For example, the terminal apparatus 200 generates UCI including an IDMA request and a scheduling request.

Next, in step S106, the terminal apparatus 200 transmits the scheduling request and the IDMA request to the base station 100. Specifically, the terminal apparatus 200 transmits the UCI generated in step S104. The base station 100 relays the received IDMA request to the communication control apparatus 300.

Then, in step S108, the communication control apparatus 300 performs IDMA execution determination processing. For example, the communication control apparatus 300 determines whether to permit signal transmission using IDMA, on the basis of a packet size of transmission data transmitted by the terminal apparatus 200, uplink channel quality, a MCS index, and the like. In the case where IDMA execution determination processing is performed in step S102 described above, this step may be omitted.

Then, in step S110, the communication control apparatus 300 performs interleaver allocation processing. Interleaver allocation processing will be described with reference to FIGS. 12 and 13; therefore, detailed description is omitted here.

Next, in step S112, the communication control apparatus 300 transmits an IDMA response to the base station 100. For example, the communication control apparatus 300 transmits an IDMA response in which information indicating a result of the allocation in step S110 is contained.

Then, in step S114, the base station 100 performs scheduling processing. For example, the base station 100 performs scheduling in accordance with the scheduling request received in step S106.

Next, in step S116, the base station 100 transmits scheduling information and the IDMA response to the terminal apparatus 200. For example, the base station 100 transmits scheduling information (Scheduling grant) indicating a result of the scheduling in step S114 by using a PDCCH. This scheduling information includes information such as the position of a RB to be used for data transmission, a modulation scheme, a data size, and a command for transmission power control. In addition, the base station 100 transmits the IDMA response received in step S112 by using a PDCCH or a PBCH.

When using a PDCCH, the base station 100 can report a parameter used for generation of an interleave pattern, in addition to information indicating an interleaver type, directly to the terminal apparatus 200. On the other hand, when using a PBCH, the base station 100 reports information associating parameters used for interleaver type allocation with interleaver types to be allocated, for example, to all the terminal apparatuses 200 within a cell. The terminal apparatus 200 uses an interleaver type associated with its attribute information or communication state in the reported information. In this case, the terminal apparatus 200 itself may allocate an interleave pattern.

Then, in step S118, the terminal apparatus 200 performs IDMA signal generation processing. For example, the terminal apparatus 200 generates a radio signal subjected to interleave processing for IDMA, by using an interleaver type and an interleave pattern indicated by information contained in the IDMA request received in step S116. This radio signal is also called an IDMA signal below.

Then, in step S120, the terminal apparatus 200 transmits the IDMA signal generated in step S118 to the base station 100. In the case where the terminal apparatus 200 itself allocates an interleave pattern, the terminal apparatus 200 contains a message including information indicating the allocated interleave pattern in UCI, for example, and transmits the UCI to the base station 100.

Next, in step S122, the base station 100 performs multi user detection. For example, the base station 100 performs signal separation using an interleaver type and an interleave pattern indicated by information contained in the IDMA request received in step S112, thereby decoding the IDMA signal transmitted by the terminal apparatus 200. In the case where an interleave pattern is allocated by the terminal apparatus 200, the base station 100 performs signal separation using an interleave pattern indicated by information contained in a message received from the terminal apparatus 200.

Then, in step S124, the base station 100 transmits an ACK signal or a NACK signal to the terminal apparatus 200, depending on whether the decoding of the IDMA signal is successful or unsuccessful.

An example of the flow of IDMA communication processing in uplink communication has been described above. Now, details of the processing in step S110 will be described with reference to FIGS. 12 and 13.

Interleaver Allocation Processing Example 1

Figure 12:
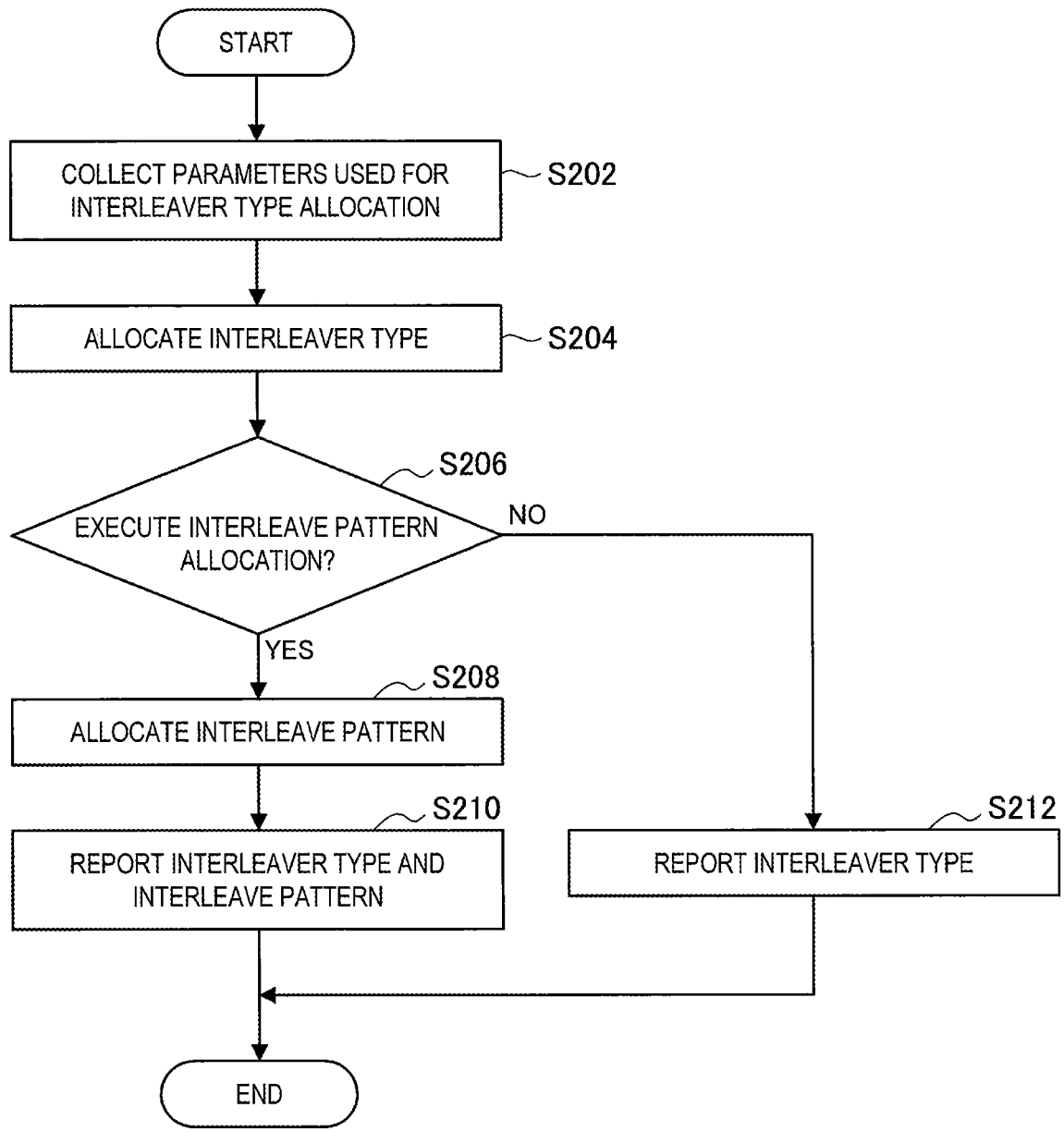
FIG. 12 is a flowchart illustrating an example of the flow of interleaver allocation processing executed in the communication control apparatus according to the present embodiment.

FIG. 12 is a flowchart illustrating an example of the flow of interleaver allocation processing executed in the communication control apparatus 300 according to the present embodiment. In this flow, static interleaver type allocation is adopted as a method for interleaver type allocation.

As illustrated in FIG. 12, first, in step S202, the control unit 330 of the communication control apparatus 300 collects parameters used for interleaver type allocation. For example, the control unit 330 collects attribute information, such as capability, a communication type, or a deployment type, of the terminal apparatus 200.

Then, in step S204, the control unit 330 allocates an interleaver type. For example, the control unit 330 may allocate an interleaver type having favorable characteristics but having a large memory usage or high calculation complexity to a terminal apparatus 200 having a large amount of memory and high arithmetic capacity, for example. Alternatively, the control unit 330 may allocate an interleaver type having a small amount of signaling for generation of an interleave pattern, for a communication type in which a small amount of signaling information is preferred, such as MTC, for example.

Next, in step S206, the control unit 330 determines whether to execute interleave pattern allocation. For example, the control unit 330 determines not to execute interleave pattern allocation in the case where the terminal apparatus 200 performs the allocation, and determines to execute interleave pattern allocation in other cases.

When interleave pattern allocation is determined to be executed (S206/YES), the control unit 330 allocates an interleave pattern in step S208. For example, the control unit 330 designates a parameter used for generation of an interleave pattern.

Then, in step S210, the control unit 330 reports the interleaver type and the interleave pattern. For example, the control unit 330 controls the communication unit 310 to transmit an IDMA response in which information indicating the allocated interleaver type and interleave pattern is contained to the terminal apparatus 200.

When interleave pattern allocation is determined not to be executed (S206/NO), the control unit 330 reports the interleaver type in step S212. For example, the control unit 330 controls the communication unit 310 to transmit an IDMA response in which information indicating the allocated interleaver type is contained to the terminal apparatus 200.

Interleaver Allocation Processing Example 2

Figure 13:
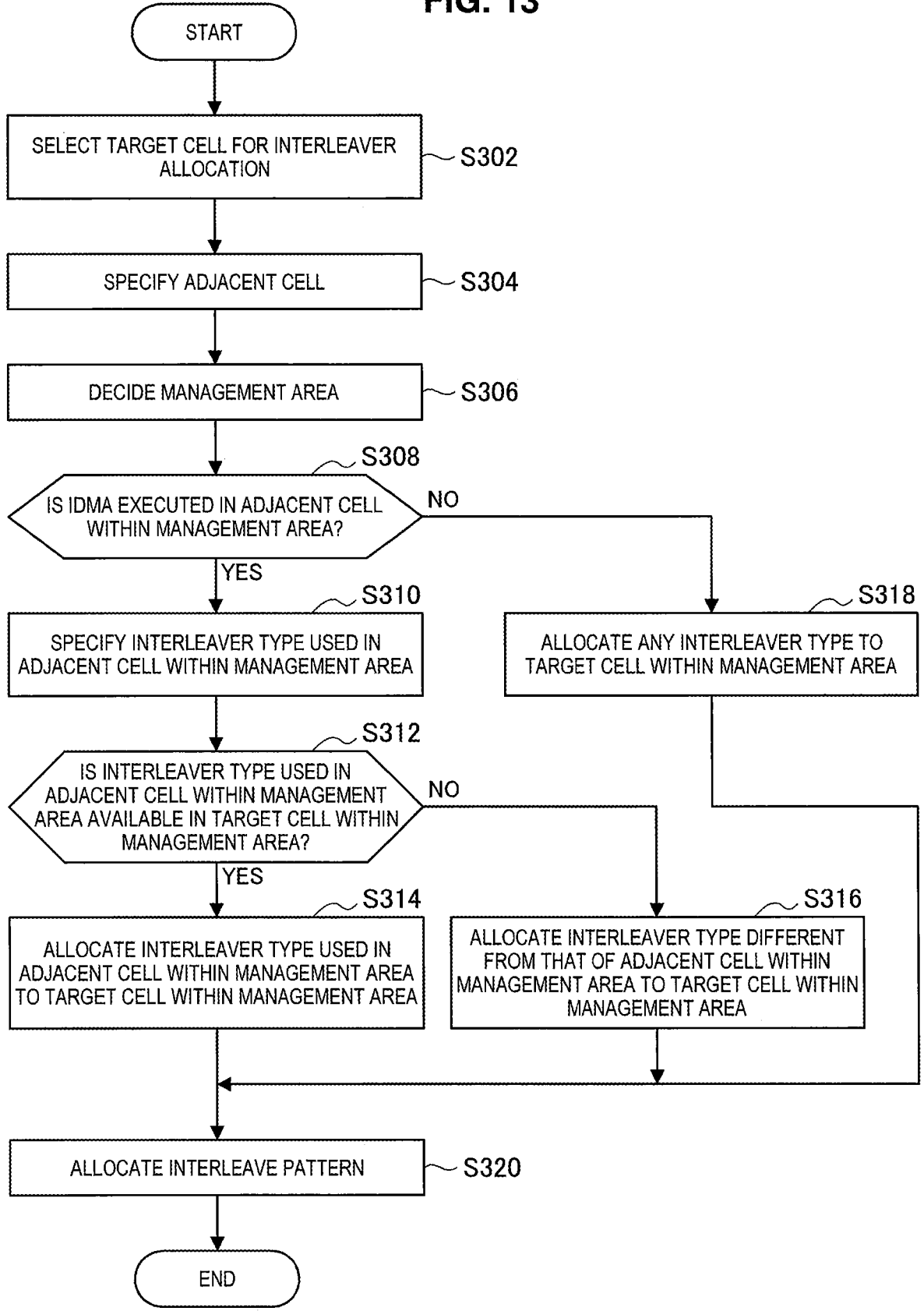
FIG. 13 is a flowchart illustrating an example of the flow of interleaver allocation processing executed in the communication control apparatus according to the present embodiment.

FIG. 13 is a flowchart illustrating an example of the flow of interleaver allocation processing executed in the communication control apparatus 300 according to the present embodiment. In this flow, dynamic interleaver type allocation is adopted as a method for interleaver type allocation.

As illustrated in FIG. 13, first, in step S302, the control unit 330 selects a target cell (sector) for interleaver allocation.

Then, in step S304, the control unit 330 specifies a cell (sector) adjacent to the target cell (sector).

Next, in step S306, the control unit 330 sets a management area. For example, the control unit 330 sets a region including the target cell and the adjacent cell as the management area.

Then, in step S308, the control unit 330 determines whether IDMA is executed in the adjacent cell within the management area.

When IDMA is determined to be executed (S308/YES), the control unit 330 specifies an interleaver type used in the adjacent cell within the management area in step S310.

Next, in step S312, the control unit 330 determines whether the interleaver type used in the adjacent cell within the management area is available in the target cell within the management area. For example, the control unit 330 determines that the interleaver type is available when interleave patterns can be allocated without overlap in the case where the same interleaver type as that of the adjacent cell is allocated to a terminal apparatus 200 in the target cell, depending on the redundant number of interleave patterns in the interleaver type. Alternatively, the control unit 330 may make the determination depending on the capability of the terminal apparatus 200, for example.

When the interleaver type used in the adjacent cell is determined to be available in the target cell within the management area (S312/YES), the control unit 330 allocates the interleaver type used in the adjacent cell to the target cell within the management area in step S314.

When the interleaver type used in the adjacent cell is determined to be unavailable in the target cell within the management area (S312/NO), the control unit 330 allocates an interleaver type different from that of the adjacent cell to the target cell within the management area in step S316.

When IDMA is determined not to be executed in the adjacent cell (S308/NO), the control unit 330 allocates any interleaver type to the target cell within the management area in step S318.

Then, in step S320, the control unit 330 allocates an interleave pattern. At this time, the control unit 330 can allocate different interleave patterns to radio communication apparatuses to which the same interleaver type is allocated belonging to the same management area. Thus, correlation characteristics are maintained between the radio communication apparatuses within the management area to which the same interleaver type is allocated. This reduces inter-cell interference within the management area.

[3-2. Downlink Communication]

Figure 14:
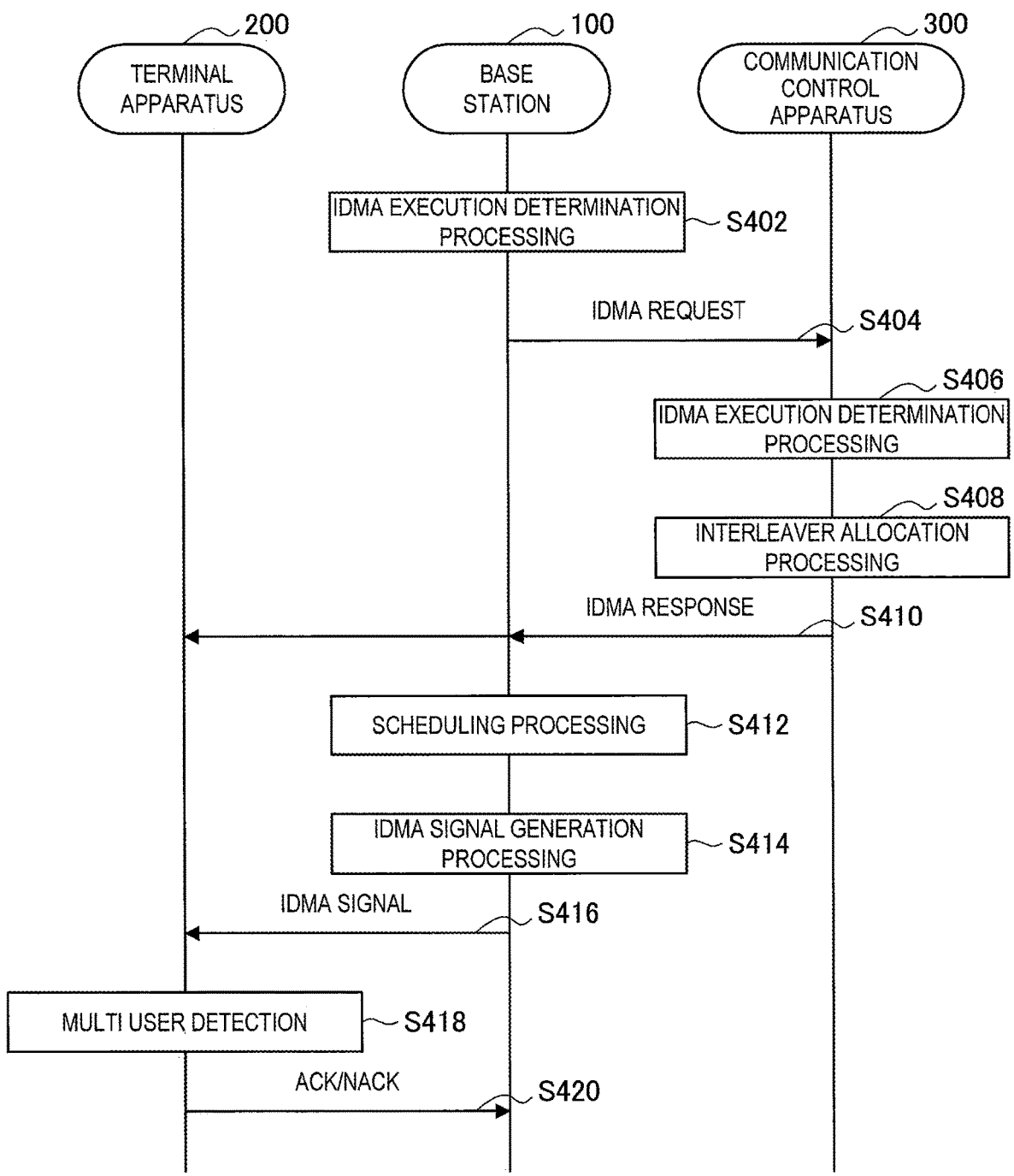
FIG. 14 is a sequence diagram illustrating an example of the flow of IDMA communication processing executed in the radio communication system according to the present embodiment.

FIG. 14 is a sequence diagram illustrating an example of the flow of IDMA communication processing executed in the radio communication system 1 according to the present embodiment. As illustrated in FIG. 14, this sequence involves the terminal apparatus 200, the base station 100, and the communication control apparatus 300. Note that downlink communication differs from uplink communication in that there is no transmission/reception of a scheduling request and that the allocation-target radio communication apparatus is the base station 100, and is the same as uplink communication in other points.

As illustrated in FIG. 14, first, in step S402, the base station 100 performs IDMA execution determination processing. In the case where IDMA execution determination processing is performed in step S406 described later, this step may be omitted.

Then, in step S404, the base station 100 transmits an IDMA request to the communication control apparatus 300.

Next, in step S406, the communication control apparatus 300 performs IDMA execution determination processing. In the case where IDMA execution determination processing is performed in step S402 described above, this step may be omitted.

Then, in step S408, the communication control apparatus 300 performs interleaver allocation processing.

Next, in step S410, the communication control apparatus 300 transmits an IDMA response to the base station 100. The base station 100 relays the received IDMA response to the terminal apparatus 200. This is for enabling multi user detection in the terminal apparatus 200. In the case where the base station 100 allocates an interleave pattern, the base station 100 transmits information indicating an interleaver type allocated by the communication control apparatus 300 and information indicating an interleave pattern allocated by the base station 100 itself to the terminal apparatus 200. Note that the reporting of information to the terminal apparatus 200 may be performed in step S416.

Then, in step S412, the base station 100 performs scheduling processing.

Then, in step S414, the base station 100 performs IDMA signal generation processing. For example, the base station 100 generates an IDMA signal subjected to interleave processing for IDMA, by using an interleaver type and an interleave pattern indicated by information contained in the IDMA request received in step S410.

Next, in step S416, the base station 100 transmits the IDMA signal generated in step S414 to the terminal apparatus 200.

Then, in step S418, the terminal apparatus 200 performs multi user detection to decode the IDMA signal transmitted by the base station 100.

Then, in step S420, the terminal apparatus 200 transmits an ACK signal or a NACK signal to the base station 100, depending on whether the decoding of the IDMA signal is successful or unsuccessful.

An example of the flow of IDMA communication processing in downlink communication has been described above.

4. APPLICATION EXAMPLES

The technology of the present disclosure is applicable to various products. For example, the communication control apparatus 300 may be realized as any type of server such as a tower server, a rack server, and a blade server. The communication control apparatus 300 may be a control module (such as an integrated circuit module including a single die, and a card or a blade that is inserted into a slot of a blade server) mounted on a server.

For example, the base station 100 may be realized as any type of evolved Node B (eNB) such as a macro eNB, and a small eNB. A small eNB may be an eNB that covers a cell smaller than a macro cell, such as a pico eNB, micro eNB, or home (femto) eNB. Instead, the base station 100 may be realized as any other types of base stations such as a NodeB and a base transceiver station (BTS). The base station 100 may include a main body (that is also referred to as a base station apparatus) configured to control radio communication, and one or more remote radio heads (RRH) disposed in a different place from the main body. Additionally, various types of terminals to be discussed later may also operate as the base station 100 by temporarily or semi-permanently executing a base station function.

For example, the terminal apparatus 200 may be realized as a mobile terminal such as a smartphone, a tablet personal computer (PC), a notebook PC, a portable game terminal, a portable/dongle type mobile router, and a digital camera, or an in-vehicle terminal such as a car navigation apparatus. The terminal apparatus 200 may also be realized as a terminal (that is also referred to as a machine type communication (MTC) terminal) that performs machine-to-machine (M2M) communication. Furthermore, the terminal apparatus 200 may be a radio communication module (such as an integrated circuit module including a single die) mounted on each of the terminals.

[4-1. Application Example Regarding Communication Control Apparatus]

Figure 15:
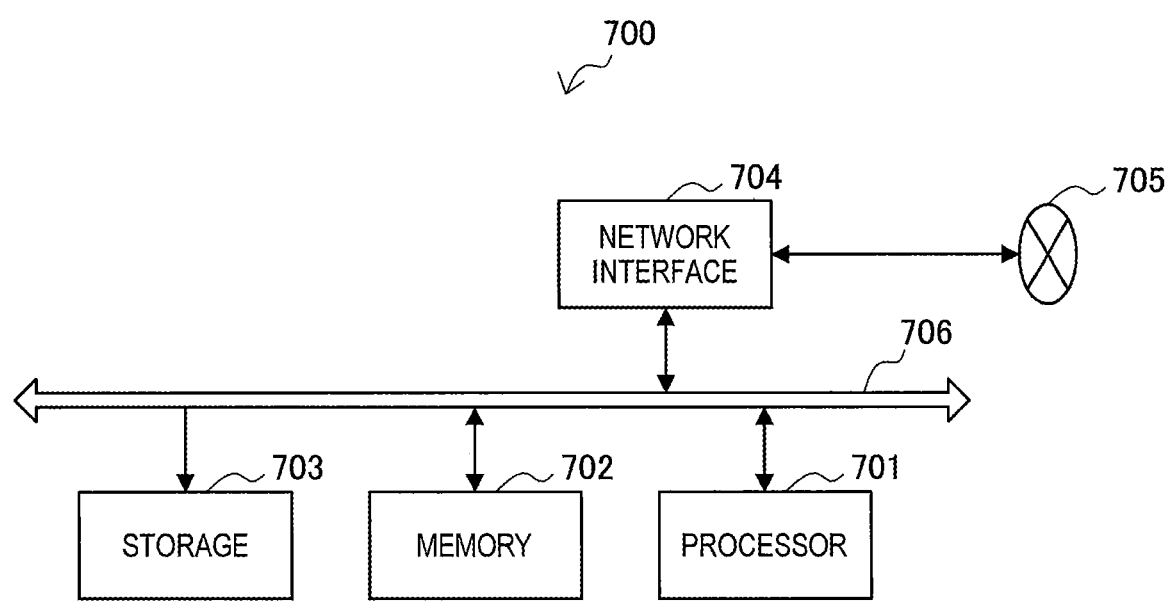
FIG. 15 is a block diagram illustrating an example of a schematic configuration of a server.

FIG. 15 is a block diagram illustrating an example of a schematic configuration of a server 700 to which the technology of the present disclosure may be applied. The server 700 includes a processor 701, a memory 702, a storage 703, a network interface 704, and a bus 706.

The processor 701 may be, for example, a central processing unit (CPU) or a digital signal processor (DSP), and controls functions of the server 700. The memory 702 includes random access memory (RAM) and read only memory (ROM), and stores a program that is executed by the processor 701 and data. The storage 703 may include a storage medium such as a semiconductor memory and a hard disk.

The network interface 704 is a wired communication interface for connecting the server 700 to a wired communication network 705. The wired communication network 705 may be a core network such as an Evolved Packet Core (EPC), or a packet data network (PDN) such as the Internet.

The bus 706 connects the processor 701, the memory 702, the storage 703, and the network interface 704 to each other.

The bus 706 may include two or more buses (such as a high speed bus and a low speed bus) each of which has different speed.

The server 700 illustrated in FIG. 15 may function as the communication control apparatus 300 described above with reference to FIG. 9. For example, the communication unit 310, the storage unit 320, and the control unit 330 may be implemented by the processor 701.

[4.2. Application Examples Regarding Base Station]

First Application Example

Figure 16:
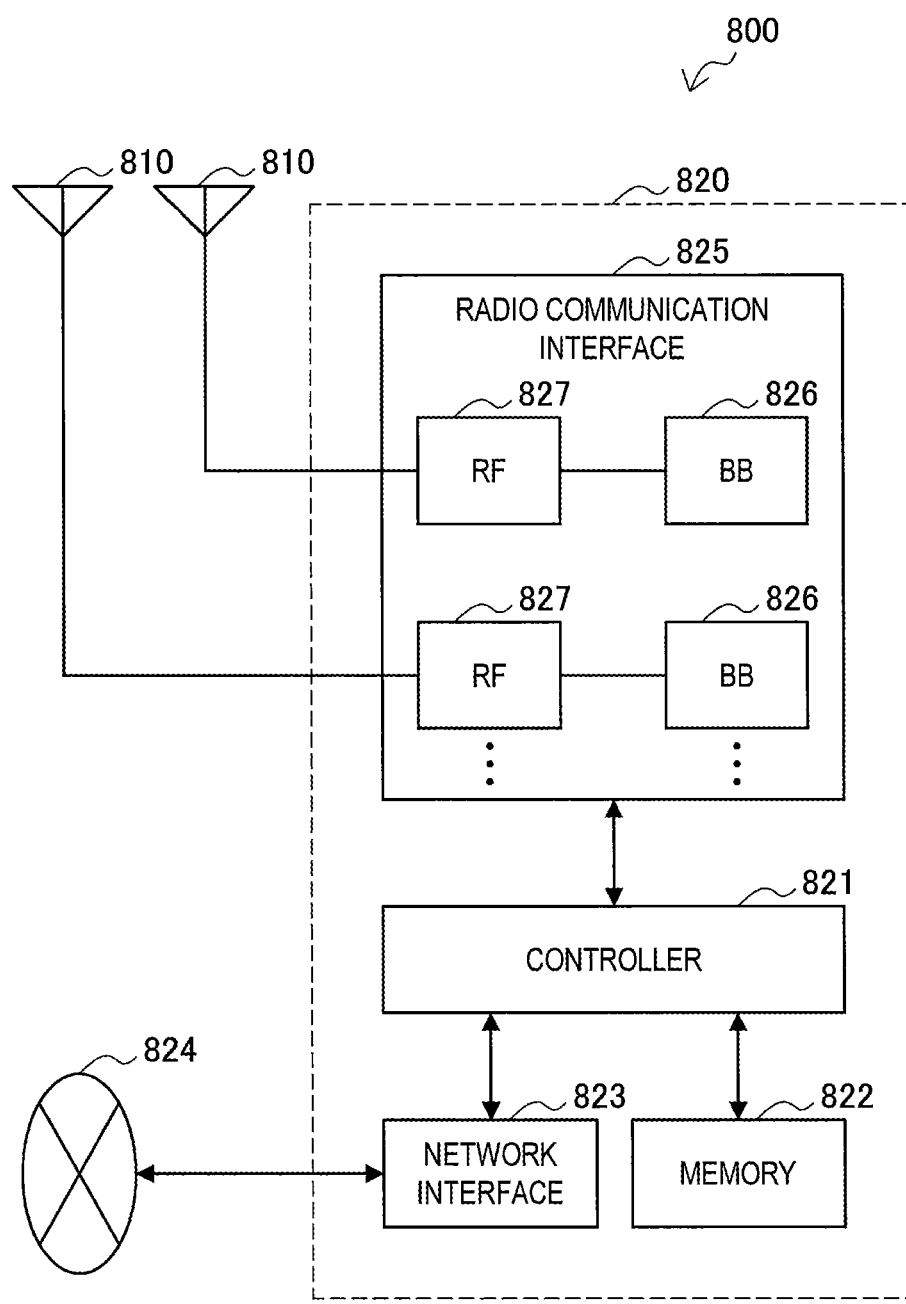
FIG. 16 is a block diagram illustrating a first example of a schematic configuration of an eNB.

FIG. 16 is a Block Diagram Illustrating a First Example of a Schematic configuration of an eNB to which the technology of the present disclosure may be applied. An eNB 800 includes one or more antennas 810 and a base station apparatus 820. Each antenna 810 and the base station apparatus 820 may be connected to each other via an RF cable.

Each of the antennas 810 includes a single or multiple antenna elements (such as multiple antenna elements included in an MIMO antenna), and is used for the base station apparatus 820 to transmit and receive radio signals. The eNB 800 may include the multiple antennas 810, as illustrated in FIG. 16. For example, the multiple antennas 810 may be compatible with multiple frequency bands used by the eNB 800. Although FIG. 16 illustrates the example in which the eNB 800 includes the multiple antennas 810, the eNB 800 may also include a single antenna 810.

The base station apparatus 820 includes a controller 821, a memory 822, a network interface 823, and a radio communication interface 825.

The controller 821 may be, for example, a CPU or a DSP, and operates various functions of a higher layer of the base station apparatus 820. For example, the controller 821 generates a data packet from data in signals processed by the radio communication interface 825, and transfers the generated packet via the network interface 823. The controller 821 may bundle data from multiple base band processors to generate the bundled packet, and transfer the generated bundled packet. The controller 821 may have logical functions of performing control such as radio resource control, radio bearer control, mobility management, admission control, and scheduling. The control may be performed in corporation with an eNB or a core network node in the vicinity. The memory 822 includes RAM and ROM, and stores a program that is executed by the controller 821, and various types of control data (such as a terminal list, transmission power data, and scheduling data).

The network interface 823 is a communication interface for connecting the base station apparatus 820 to a core network 824. The controller 821 may communicate with a core network node or another eNB via the network interface 823. In that case, the eNB 800, and the core network node or the other eNB may be connected to each other through a logical interface (such as an S1 interface and an X2 interface). The network interface 823 may also be a wired communication interface or a radio communication interface for radio backhaul. If the network interface 823 is a radio communication interface, the network interface 823 may use a higher frequency band for radio communication than a frequency band used by the radio communication interface 825.

The radio communication interface 825 supports any cellular communication scheme such as Long Term Evolution (LTE) and LTE-Advanced, and provides radio connection to a terminal positioned in a cell of the eNB 800 via the antenna 810. The radio communication interface 825 may typically include, for example, a baseband (BB) processor 826 and an RF circuit 827. The BB processor 826 may perform, for example, encoding/decoding, modulating/demodulating, and multiplexing/demultiplexing, and performs various types of signal processing of layers (such as L1, medium access control (MAC), radio link control (RLC), and a packet data convergence protocol (PDCP)). The BB processor 826 may have a part or all of the above-described logical functions instead of the controller 821. The BB processor 826 may be a memory that stores a communication control program, or a module that includes a processor and a related circuit configured to execute the program. Updating the program may allow the functions of the BB processor 826 to be changed. The module may be a card or a blade that is inserted into a slot of the base station apparatus 820. Alternatively, the module may also be a chip that is mounted on the card or the blade. Meanwhile, the RF circuit 827 may include, for example, a mixer, a filter, and an amplifier, and transmits and receives radio signals via the antenna 810.

The radio communication interface 825 may include the multiple BB processors 826, as illustrated in FIG. 16. For example, the multiple BB processors 826 may be compatible with multiple frequency bands used by the eNB 800. The radio communication interface 825 may include the multiple RF circuits 827, as illustrated in FIG. 16. For example, the multiple RF circuits 827 may be compatible with multiple antenna elements. Although FIG. 16 illustrates the example in which the radio communication interface 825 includes the multiple BB processors 826 and the multiple RF circuits 827, the radio communication interface 825 may also include a single BB processor 826 or a single RF circuit 827.

Second Application Example

Figure 17:
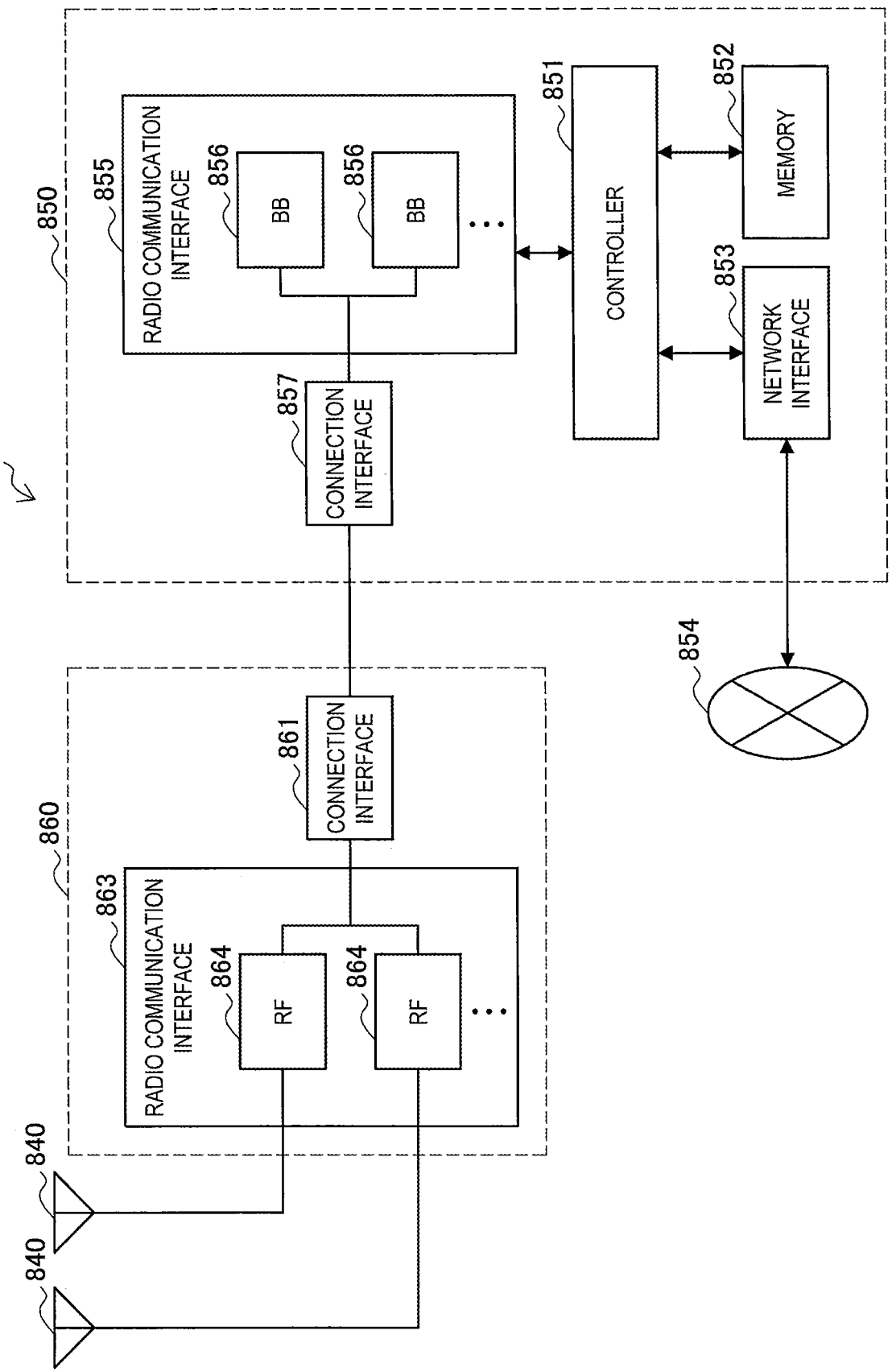
FIG. 17 is a block diagram illustrating a second example of a schematic configuration of an eNB.

FIG. 17 is a block diagram illustrating a second example of a schematic configuration of an eNB to which the technology of the present disclosure may be applied. An eNB 830 includes one or more antennas 840, a base station apparatus 850, and an RRH 860. Each antenna 840 and the RRH 860 may be connected to each other via an RF cable. The base station apparatus 850 and the RRH 860 may be connected to each other via a high speed line such as an optical fiber cable.

Each of the antennas 840 includes a single or multiple antenna elements (such as multiple antenna elements included in an MIMO antenna), and is used for the RRH 860 to transmit and receive radio signals. The eNB 830 may include the multiple antennas 840, as illustrated in FIG. 17. For example, the multiple antennas 840 may be compatible with multiple frequency bands used by the eNB 830. Although FIG. 17 illustrates the example in which the eNB 830 includes the multiple antennas 840, the eNB 830 may also include a single antenna 840.

The base station apparatus 850 includes a controller 851, a memory 852, a network interface 853, a radio communication interface 855, and a connection interface 857. The controller 851, the memory 852, and the network interface 853 are the same as the controller 821, the memory 822, and the network interface 823 described with reference to FIG. 16.

The radio communication interface 855 supports any cellular communication scheme such as LTE and LTE-Advanced, and provides radio communication to a terminal positioned in a sector corresponding to the RRH 860 via the RRH 860 and the antenna 840. The radio communication interface 855 may typically include, for example, a BB processor 856. The BB processor 856 is the same as the BB processor 826 described with reference to FIG. 16, except the BB processor 856 is connected to the RF circuit 864 of the RRH 860 via the connection interface 857. The radio communication interface 855 may include the multiple BB processors 856, as illustrated in FIG. 17. For example, the multiple BB processors 856 may be compatible with multiple frequency bands used by the eNB 830. Although FIG. 17 illustrates the example in which the radio communication interface 855 includes the multiple BB processors 856, the radio communication interface 855 may also include a single BB processor 856.

The connection interface 857 is an interface for connecting the base station apparatus 850 (radio communication interface 855) to the RRH 860. The connection interface 857 may also be a communication module for communication in the above-described high speed line that connects the base station apparatus 850 (radio communication interface 855) to the RRH 860.

The RRH 860 includes a connection interface 861 and a radio communication interface 863.

The connection interface 861 is an interface for connecting the RRH 860 (radio communication interface 863) to the base station apparatus 850. The connection interface 861 may also be a communication module for communication in the above-described high speed line.

The radio communication interface 863 transmits and receives radio signals via the antenna 840. The radio communication interface 863 may typically include, for example, the RF circuit 864. The RF circuit 864 may include, for example, a mixer, a filter, and an amplifier, and transmits and receives radio signals via the antenna 840. The radio communication interface 863 may include multiple RF circuits 864, as illustrated in FIG. 17. For example, the multiple RF circuits 864 may support multiple antenna elements. Although FIG. 17 illustrates the example in which the radio communication interface 863 includes the multiple RF circuits 864, the radio communication interface 863 may also include a single RF circuit 864.

The eNB 800 and the eNB 830 illustrated in FIGS. 16 and 17 may function as the base station 100 described above with reference to FIG. 7. For example, the radio communication unit 110, the communication unit 120, the storage unit 130, and the control unit 140 may be implemented by the radio communication interface 825, and the radio communication interface 855 and/or the radio communication interface 863. At least a part of these functions may be implemented by the controller 821 and the controller 851.

[4.3. Application examples regarding terminal apparatus]

First Application Example

Figure 18:
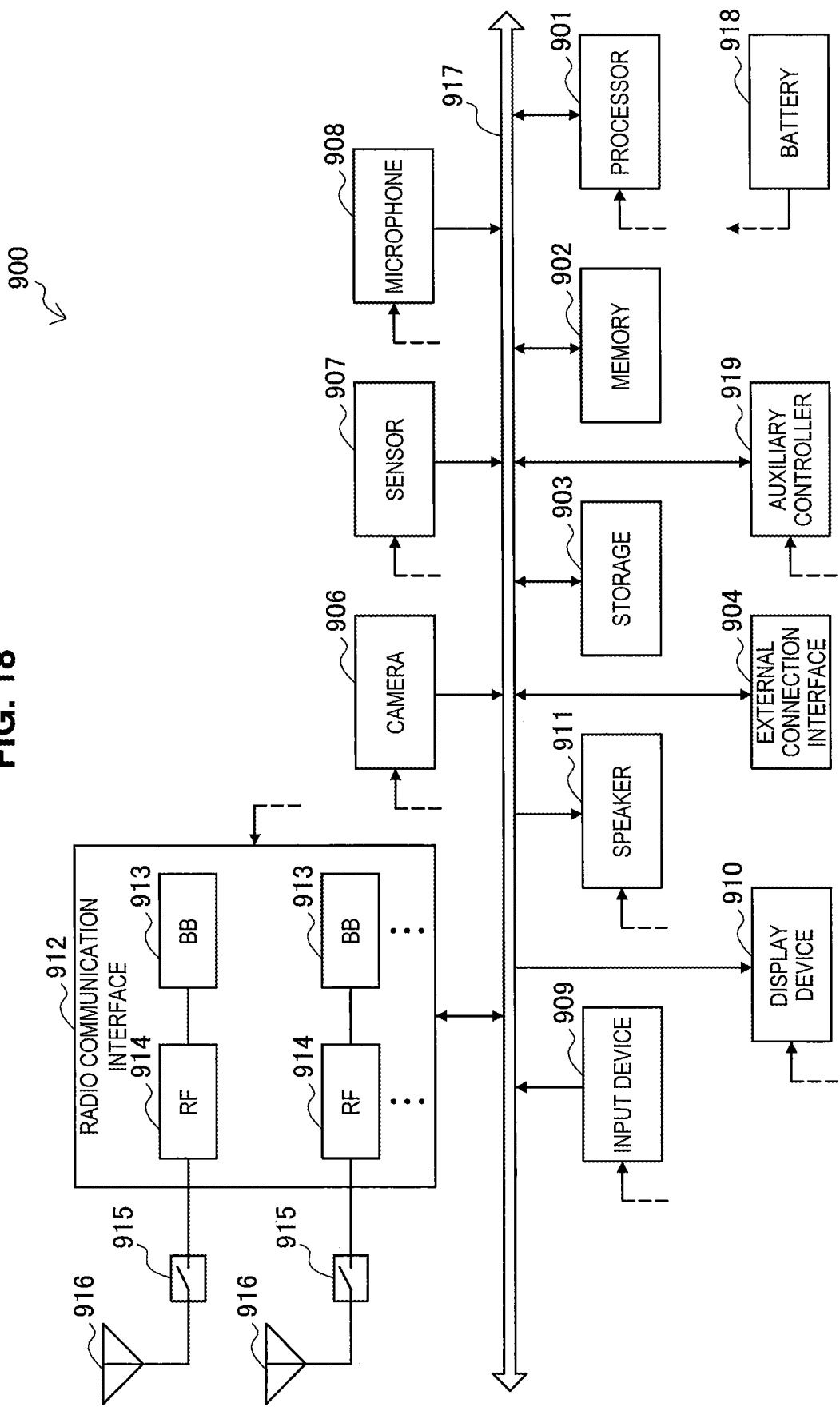
FIG. 18 is a block diagram illustrating an example of a schematic configuration of a smartphone.

FIG. 18 is a Block Diagram Illustrating an Example of a Schematic configuration of a smartphone 900 to which the technology of the present disclosure may be applied. The smartphone 900 includes a processor 901, a memory 902, a storage 903, an external connection interface 904, a camera 906, a sensor 907, a microphone 908, an input device 909, a display device 910, a speaker 911, a radio communication interface 912, one or more antenna switches 915, one or more antennas 916, a bus 917, a battery 918, and an auxiliary controller 919.

The processor 901 may be, for example, a CPU or a system on a chip (SoC), and controls functions of an application layer and another layer of the smartphone 900. The memory 902 includes RAM and ROM, and stores a program that is executed by the processor 901, and data. The storage 903 may include a storage medium such as a semiconductor memory and a hard disk. The external connection interface 904 is an interface for connecting an external device such as a memory card and a universal serial bus (USB) device to the smartphone 900.

The camera 906 includes an image sensor such as a charge coupled device (CCD) and a complementary metal oxide semiconductor (CMOS), and generates a captured image. The sensor 907 may include a group of sensors such as a measurement sensor, a gyro sensor, a geomagnetic sensor, and an acceleration sensor. The microphone 908 converts sounds that are input to the smartphone 900 to audio signals. The input device 909 includes, for example, a touch sensor configured to detect touch onto a screen of the display device 910, a keypad, a keyboard, a button, or a switch, and receives an operation or an information input from a user. The display device 910 includes a screen such as a liquid crystal display (LCD) and an organic light-emitting diode (OLED) display, and displays an output image of the smartphone 900. The speaker 911 converts audio signals that are output from the smartphone 900 to sounds.

The radio communication interface 912 supports any cellular communication scheme such as LTE and LTE-Advanced, and performs radio communication. The radio communication interface 912 may typically include, for example, a BB processor 913 and an RF circuit 914. The BB processor 913 may perform, for example, encoding/decoding, modulating/demodulating, and multiplexing/demultiplexing, and performs various types of signal processing for radio communication. Meanwhile, the RF circuit 914 may include, for example, a mixer, a filter, and an amplifier, and transmits and receives radio signals via the antenna 916. The radio communication interface 913 may also be a one chip module that has the BB processor 913 and the RF circuit 914 integrated thereon. The radio communication interface 912 may include the multiple BB processors 913 and the multiple RF circuits 914, as illustrated in FIG. 18. Although FIG. 18 illustrates the example in which the radio communication interface 913 includes the multiple BB processors 913 and the multiple RF circuits 914, the radio communication interface 912 may also include a single BB processor 913 or a single RF circuit 914.

Furthermore, in addition to a cellular communication scheme, the radio communication interface 912 may support another type of radio communication scheme such as a short-distance wireless communication scheme, a near field communication scheme, and a radio local area network (LAN) scheme. In that case, the radio communication interface 912 may include the BB processor 913 and the RF circuit 914 for each radio communication scheme.

Each of the antenna switches 915 switches connection destinations of the antennas 916 among multiple circuits (such as circuits for different radio communication schemes) included in the radio communication interface 912.

Each of the antennas 916 includes a single or multiple antenna elements (such as multiple antenna elements included in an MIMO antenna), and is used for the radio communication interface 912 to transmit and receive radio signals. The smartphone 900 may include the multiple antennas 916, as illustrated in FIG. 18. Although FIG. 18 illustrates the example in which the smartphone 900 includes the multiple antennas 916, the smartphone 900 may also include a single antenna 916.

Furthermore, the smartphone 900 may include the antenna 916 for each radio communication scheme. In that case, the antenna switches 915 may be omitted from the configuration of the smartphone 900.

The bus 917 connects the processor 901, the memory 902, the storage 903, the external connection interface 904, the camera 906, the sensor 907, the microphone 908, the input device 909, the display device 910, the speaker 911, the radio communication interface 912, and the auxiliary controller 919 to each other. The battery 918 supplies power to blocks of the smartphone 900 illustrated in FIG. 18 via feeder lines, which are partially shown as dashed lines in the figure. The auxiliary controller 919 operates a minimum necessary function of the smartphone 900, for example, in a sleep mode.

The smartphone 900 illustrated in FIG. 18 may function as the terminal apparatus 200 described above with reference to FIG. 8. For example, the radio communication unit 210, the storage unit 220, and the control unit 230 may be implemented by the radio communication interface 912. At least a part of these functions may be implemented by the processor 901 or the auxiliary controller 919.

Second Application Example

Figure 19:
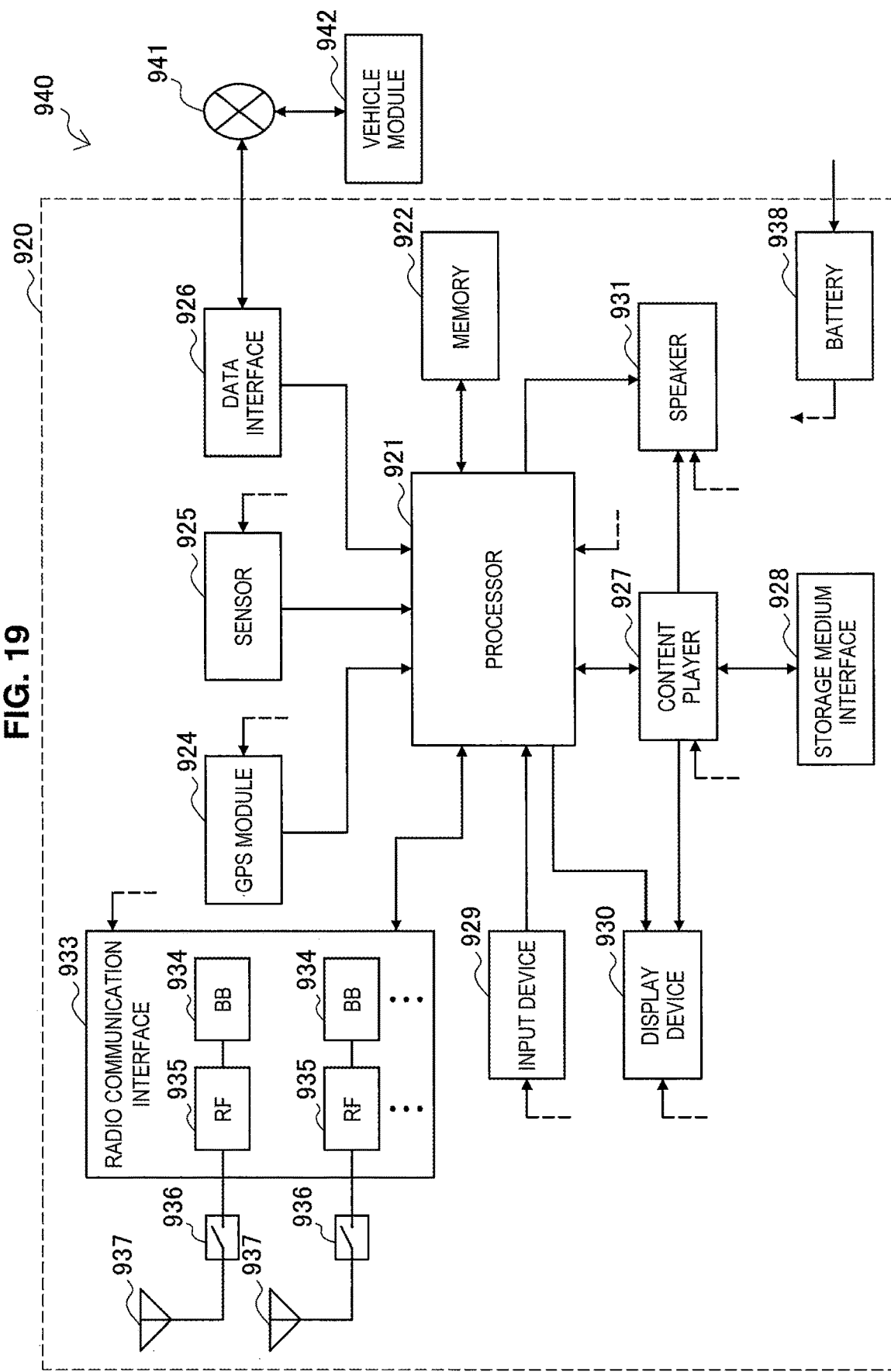
FIG. 19 is a block diagram illustrating an example of a schematic configuration of a car navigation apparatus.

FIG. 19 is a block diagram illustrating an example of a schematic configuration of a car navigation apparatus 920 to which the technology of the present disclosure may be applied. The car navigation apparatus 920 includes a processor 921, a memory 922, a global positioning system (GPS) module 924, a sensor 925, a data interface 926, a content player 927, a storage medium interface 928, an input device 929, a display device 930, a speaker 931, a radio communication interface 933, one or more antenna switches 936, one or more antennas 937, and a battery 938.

The processor 921 may be, for example, a CPU or a SoC, and controls a navigation function and another function of the car navigation apparatus 920. The memory 922 includes RAM and ROM, and stores a program that is executed by the processor 921, and data.

The GPS module 924 uses GPS signals received from a GPS satellite to measure a position (such as latitude, longitude, and altitude) of the car navigation apparatus 920. The sensor 925 may include a group of sensors such as a gyro sensor, a geomagnetic sensor, and a barometric sensor. The data interface 926 is connected to, for example, an in-vehicle network 941 via a terminal that is not shown, and acquires data generated by the vehicle, such as vehicle speed data.

The content player 927 plays content stored in a storage medium (such as a CD and a DVD) that is inserted into the storage medium interface 928. The input device 929 includes, for example, a touch sensor configured to detect touch onto a screen of the display device 930, a button, or a switch, and receives an operation or an information input from a user. The display device 930 includes a screen such as a LCD or an OLED display, and displays an image of the navigation function or content that is played. The speaker 931 outputs sounds of the navigation function or the content that is played.

The radio communication interface 933 supports any cellular communication scheme such as LET and LTE-Advanced, and performs radio communication. The radio communication interface 933 may typically include, for example, a BB processor 934 and an RF circuit 935. The BB processor 934 may perform, for example, encoding/decoding, modulating/demodulating, and multiplexing/demultiplexing, and performs various types of signal processing for radio communication. Meanwhile, the RF circuit 935 may include, for example, a mixer, a filter, and an amplifier, and transmits and receives radio signals via the antenna 937. The radio communication interface 933 may be a one chip module having the BB processor 934 and the RF circuit 935 integrated thereon. The radio communication interface 933 may include the multiple BB processors 934 and the multiple RF circuits 935, as illustrated in FIG. 19. Although FIG. 19 illustrates the example in which the radio communication interface 933 includes the multiple BB processors 934 and the multiple RF circuits 935, the radio communication interface 933 may also include a single BB processor 934 or a single RF circuit 935.

Furthermore, in addition to a cellular communication scheme, the radio communication interface 933 may support another type of radio communication scheme such as a short-distance wireless communication scheme, a near field communication scheme, and a radio LAN scheme. In that case, the radio communication interface 933 may include the BB processor 934 and the RF circuit 935 for each radio communication scheme.

Each of the antenna switches 936 switches connection destinations of the antennas 937 among multiple circuits (such as circuits for different radio communication schemes) included in the radio communication interface 933.

Each of the antennas 937 includes a single or multiple antenna elements (such as multiple antenna elements included in an MIMO antenna), and is used for the radio communication interface 933 to transmit and receive radio signals. The car navigation apparatus 920 may include the multiple antennas 937, as illustrated in FIG. 19. Although FIG. 19 illustrates the example in which the car navigation apparatus 920 includes the multiple antennas 937, the car navigation apparatus 920 may also include a single antenna 937.

Furthermore, the car navigation apparatus 920 may include the antenna 937 for each radio communication scheme. In that case, the antenna switches 936 may be omitted from the configuration of the car navigation apparatus 920.

The battery 938 supplies power to blocks of the car navigation apparatus 920 illustrated in FIG. 19 via feeder lines that are partially shown as dashed lines in the figure. The battery 938 accumulates power supplied from the vehicle.

The car navigation apparatus 920 illustrated in FIG. 19 may function as the terminal apparatus 200 described above with reference to FIG. 8. For example, the radio communication unit 210, the storage unit 220, and the control unit 230 may be implemented by the radio communication interface 933. At least a part of these functions may be implemented by the processor 921.

The technology of the present disclosure may also be realized as an in-vehicle system (or a vehicle) 940 including one or more blocks of the car navigation apparatus 920, the in-vehicle network 941, and a vehicle module 942. The vehicle module 942 generates vehicle data such as vehicle speed, engine speed, and trouble information, and outputs the generated data to the in-vehicle network 941.

5. CONCLUSION

An embodiment of the present disclosure has been described in detail with reference to FIGS. 1 to 19. As described above, the communication control apparatus 300 according to the present embodiment allocates an interleaver type of an interleaver to be used for IDMA by the radio communication apparatus (the base station 100 or the terminal apparatus 200) of the radio communication system 1 using IDMA. Thus, various types of interleavers are available in the radio communication system 1 according to the present embodiment, which enables high flexibility demanded in 5G to be achieved.

The communication control apparatus 300 may adopt, as a method for interleaver type allocation, one of static allocation based on attribute information related to the radio communication apparatus and dynamic allocation based on a communication state of the radio communication apparatus. Interleavers allocated by various methods are available in the radio communication system 1 according to the present embodiment, which enables high flexibility demanded in 5G to be achieved.

In interleaver type allocation, the communication control apparatus 300 may set a management area, and allocate the same interleaver type preferentially to radio communication apparatuses belonging to the set management area. Thus, the same interleaver type is allocated to the radio communication apparatuses within the management area. Since correlation characteristics are maintained between interleave patterns of the same interleaver type, interference between radio communication apparatuses within the management area is suppressed.

The communication control apparatus 300 may allocate an interleave pattern to be used for IDMA by the radio communication apparatus. In uplink communication, in the case where the terminal apparatus 200 selects an interleave pattern to use by itself, it may be difficult to maintain favorable correlation characteristics (decorrelation) between terminal apparatuses 200. In this point, interference can be avoided by the communication control apparatus 300 collectively allocating interleave patterns to be used by the terminal apparatuses 200.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Note that a series of processes by each apparatus described in the present specification may be realized using any of software, hardware, or a combination of software and hardware. A program constituting software is contained in, for example, a storage medium (a non-transitory medium) provided inside or outside of each apparatus beforehand. In addition, each program is read by, for example, a RAM being executed by a computer and executed by a processor such as a CPU.

Note that it is not necessary for the processing described in this specification with reference to the flowchart to be executed in the order shown in the flowchart. Some processing steps may be performed in parallel. Further, some of additional steps can be adopted, or some processing steps can be omitted.

Further, the effects described in this specification are merely illustrative or exemplified effects, and are not limitative. That is, with or in the place of the above effects, the technology according to the present disclosure may achieve other effects that are clear to those skilled in the art from the description of this specification. Additionally, the present technology may also be configured as below.

(1)

A communication control apparatus including:

a communication unit configured to communicate with a radio communication apparatus of a radio communication system using interleave division multiple access (IDMA); and a control unit configured to allocate an interleaver type of an interleaver to be used for IDMA by the radio communication apparatus.

(2)

The communication control apparatus according to (1), wherein the communication unit transmits a message including information indicating the interleaver type allocated by the control unit to the radio communication apparatus.

(3)

The communication control apparatus according to (2), wherein the message is transmitted using a system information block (SIB) or downlink control information (DCI).

(4)

The communication control apparatus according to any one of (1) to (3), wherein the control unit allocates the interleaver type on the basis of attribute information related to the radio communication apparatus.

(5)

The communication control apparatus according to any one of (1) to (4), wherein the control unit allocates the interleaver type on the basis of a communication state related to the radio communication apparatus.

(6)

The communication control apparatus according to (5), wherein the control unit sets a management area, and allocates the same interleaver type preferentially to radio communication apparatuses belonging to the set management area.

(7)

The communication control apparatus according to any one of (1) to (6), wherein the control unit allocates an interleave pattern to be used for IDMA by the radio communication apparatus.

(8)

The communication control apparatus according to (7), wherein the control unit allocates different interleave patterns to radio communication apparatuses to which the same interleaver type is allocated.

(9)

The communication control apparatus according to (7) or (8), wherein the communication unit transmits a message including information indicating the interleave pattern allocated by the control unit to the radio communication apparatus.

(10)

The communication control apparatus according to (9), wherein the information indicating the interleave pattern is a parameter used by the control unit to allocate the interleave pattern.

(11)

A radio communication apparatus including:

a radio communication unit configured to perform radio communication using IDMA with a base station; and a control unit configured to control the radio communication unit to perform interleave processing for IDMA by using an interleaver of an allocated interleaver type.

(12)

The radio communication apparatus according to (11), wherein the radio communication unit transmits a message requesting allocation of the interleaver type to the base station.

(13)

The radio communication apparatus according to (11) or (12), wherein the control unit controls the radio communication unit to perform interleave processing for IDMA by using an allocated interleave pattern.

(14)

The radio communication apparatus according to (11) or (12), wherein the control unit selects an interleave pattern to be used for the interleave processing performed by the radio communication unit.

(15)

The radio communication apparatus according to (14), wherein the control unit controls the radio communication unit to transmit a message including information indicating the selected interleave pattern to the base station.

(16)

The radio communication apparatus according to (15), wherein the message is included in uplink control information (UCI).

(17)

A communication control method including:

communicating with a radio communication apparatus of a radio communication system using interleave division multiple access (IDMA); and allocating, by a processor, an interleaver type of an interleaver to be used for IDMA by the radio communication apparatus.

(18)

A radio communication method including:

performing radio communication using IDMA with a base station; and performing control by a processor to perform interleave processing for IDMA by using an interleaver of an allocated interleaver type.

(19)

A program causing a computer to function as:

a communication unit configured to communicate with a radio communication apparatus of a radio communication system using interleave division multiple access (IDMA); and a control unit configured to allocate an interleaver type of an interleaver to be used for IDMA by the radio communication apparatus.

(20)

A program causing a computer to function as:

a radio communication unit configured to perform radio communication using IDMA with a base station; and a control unit configured to control the radio communication unit to perform interleave processing for IDMA by using an interleaver of an allocated interleaver type.

REFERENCE SIGNS LIST 1 radio communication system
100 base station
110 radio communication unit
120 communication unit
130 storage unit
140 control unit
200 terminal apparatus
210 radio communication unit
220 storage unit
230 control unit
300 communication control apparatus
310 communication unit
320 storage unit
330 control unit
400 cell
500 core network
600 management area

The invention claimed is:

1. A communication control apparatus, comprising:
circuitry configured to:
communicate with a radio communication apparatus of a radio communication system;
acquire attribute information of the radio communication apparatus, wherein the attribute information includes at least a memory capacity of the radio communication apparatus; and
allocate, based on the memory capacity of the radio communication apparatus, a first interleaver pattern of a first interleaver to the radio communication apparatus.

2. The communication control apparatus according to claim 1, wherein
the first interleaver pattern facilitates the radio communication apparatus to communicate based on a signal processing operation, and
the signal processing operation is based on an interleave processing operation.

3. The communication control apparatus according to claim 2, wherein the circuitry is further configured to transmit to the radio communication apparatus, a message that includes information that indicates the first interleaver pattern for the radio communication apparatus.

4. The communication control apparatus according to claim 3, wherein the circuitry is further configured to transmit the message via one of a system information block (SIB) or downlink control information (DCI).

5. The communication control apparatus according to claim 1, wherein the circuitry is further configured to allocate the first interleaver pattern based on a communication state of the radio communication apparatus.

6. The communication control apparatus according to claim 5, wherein the circuitry is further configured to:
set a management area, wherein the management area includes at least two radio communication apparatuses of the radio communication system; and
allocate, to the at least two radio communication apparatuses, a second interleaver pattern of a second interleaver.

7. The communication control apparatus according to claim 1, wherein
the circuitry is further configured to allocate an interleave type,
the interleave type facilitates the radio communication apparatus to communicate based on a signal processing operation, and
the signal processing operation is based on an interleave processing operation.

8. The communication control apparatus according to claim 7, wherein the circuitry is further configured to:
allocate, a second interleaver type of a second interleaver, to each of a first radio communication apparatus and a second radio communication apparatus; and
allocate, a first interleave pattern to the first radio communication apparatus and a second interleave pattern to the second radio communication apparatus, wherein the first interleave pattern is different from the second interleave pattern.

9. The communication control apparatus according to claim 7, wherein the circuitry is further configured to transmit to the radio communication apparatus, a message that indicates the allocated interleave type for the radio communication apparatus.

10. The communication control apparatus according to claim 9, wherein
 the circuitry is further configured to allocate the interleave type based on a parameter in the message, and
 the message indicates the interleave type as the parameter.

11. A radio communication apparatus, comprising:
 circuitry configured to:
  transmit attribute information to a base station; and
  receive from the base station, first information that indicates an interleaver pattern of an interleaver for the radio communication apparatus, wherein:
  the base station allocates the interleaver pattern of the interleaver based on a memory capacity of the radio communication apparatus, and
  the attribute information of the radio communication apparatus includes at least the memory capacity of the radio communication apparatus.

12. The radio communication apparatus according to claim 11, wherein the circuitry is further configured to transmit, to the base station, a message request to allocate the interleaver pattern to the radio communication apparatus.

13. The radio communication apparatus according to claim 11, wherein the circuitry is further configured to:
 receive, from the base station, second information that indicates an interleave type for the radio communication apparatus,
  wherein the base station allocates the interleave type based on at least a parameter; and
 control an interleave processing operation based on the interleave type.

14. The radio communication apparatus according to claim 11, wherein the circuitry is further configured to select at least one interleave type to execute an interleave processing operation.

15. The radio communication apparatus according to claim 14, wherein:
 the circuitry is further configured to transmit a message to the base station, and
 the message indicates the selected at least one interleave type.

16. The radio communication apparatus according to claim 15, wherein the message is include in uplink control information (UCI).

17. A communication control method, comprising:
 in a communication control apparatus:
  communicating with a radio communication apparatus of a radio communication system;
  acquiring attribute information of the radio communication apparatus, wherein the attribute information includes at least a memory capacity of the radio communication apparatus; and
  allocating, based on the memory capacity of the radio communication apparatus, an interleaver pattern of an interleaver to the radio communication apparatus.

18. A radio communication method, comprising:
 in a radio communication apparatus:
 transmitting attribute information to a base station; and
 receiving, from the base station, first information that indicates an interleaver pattern of an interleaver for the radio communication apparatus, wherein:
  the base station allocates the interleaver pattern of the interleaver based on a memory capacity of the radio communication apparatus, and
  the attribute information of the radio communication apparatus includes at least the memory capacity of the radio communication apparatus.

19. A non-transitory computer-readable medium having stored thereon, computer-executable instructions, which when executed by a communication control apparatus, cause the communication control apparatus to execute operations, the operations comprising:
 communicating with a radio communication apparatus of a radio communication system;
 acquiring attribute information of the radio communication apparatus,
  wherein the attribute information includes at least a memory capacity of the radio communication apparatus; and
 allocating, based on the memory capacity of the radio communication apparatus, an interleaver type pattern of an interleaver to the radio communication apparatus.

20. A non-transitory computer-readable medium having stored thereon, computer-executable instructions, which when executed by a radio communication apparatus, cause the radio communication apparatus to execute operations, the operations comprising:
 transmitting attribute information to a base station; and
 receiving from the base station, first information that indicates an interleaver pattern of an interleaver for the radio communication apparatus, wherein:
  the base station allocates the interleaver pattern of the interleaver based on a memory capacity of the radio communication apparatus, and
  the attribute information of the radio communication apparatus includes at least the memory capacity of the radio communication apparatus.

21. A communication control apparatus, comprising:
 circuitry configured to:
  communicate with at least two radio communication apparatuses of a radio communication system;
  set a management area, wherein the management area includes the at least two radio communication apparatuses;
  acquire information that indicates a communication state of the at least two radio communication apparatuses; and
  allocate, based on the acquired information, a first interleaver pattern of an interleaver to the at least two radio communication apparatuses within the management area.

22. The communication control method according to claim 17, wherein
 the interleaver pattern facilitates the radio communication apparatus to communicate based on a signal processing, and
 the signal processing is based on an interleave processing.

23. The communication control method according to claim 22, further comprising transmitting to the radio communication apparatus, a message that includes information that indicates the interleaver pattern for the radio communication apparatus.

24. The communication control method according to claim 23, further comprising transmitting the message via one of a system information block (SIB) or downlink control information (DCI).

25. The communication control method according to claim 17, further comprising allocating the interleaver pattern based on a communication state of the radio communication apparatus.

26. The communication control method according to claim 25, further comprising:
  setting a management area, wherein the management area includes at least two radio communication apparatuses of the radio communication system; and
  allocating, to the at least two radio communication apparatuses, a second interleaver pattern of a second interleaver.

27. The communication control method according to claim 17, further comprising allocating an interleave type, wherein
  the interleave type facilitates the radio communication apparatus to communicate based on a signal processing, and
  the signal processing is based on an interleave processing.

28. The communication control method according to claim 27, further comprising:
  allocating, a second interleaver type of a second interleaver, to each of a first radio communication apparatus and a second radio communication apparatus; and
  allocating, a first interleave pattern to the first radio communication apparatus and a second interleave pattern to the second radio communication apparatus, wherein the first interleave pattern is different from the second interleave pattern.

29. The communication control method according to claim 27, further comprising transmitting to the radio communication apparatus, a message that indicates the allocated interleave type for the radio communication apparatus.

30. The communication control method according to claim 29, further comprising allocating the interleave type based on a parameter in the message, wherein the message indicates the interleave type as the parameter.

31. The radio communication method according to claim 18, further comprising transmitting, to the base station, a message request to allocate the interleaver pattern to the radio communication apparatus.

32. The radio communication method according to claim 18, further comprising:
  receiving, from the base station, second information that indicates an interleave type for the radio communication apparatus,
    wherein the base station allocates the interleave type based on at least a parameter; and
  controlling an interleave processing based on the interleave type.

33. The radio communication method according to claim 18, further comprising selecting at least one interleave type to execute an interleave processing.

34. The radio communication method according to claim 33, further comprising transmitting a message to the base station, wherein the message indicates the selected at least one interleave type.

35. The radio communication method according to claim 34, wherein the message is include in uplink control information (UCI).

* * * * *